(12) United States Patent
Yang

(10) Patent No.: US 7,939,374 B2
(45) Date of Patent: May 10, 2011

(54) SUPPLY MECHANISM FOR THE CHUCK OF AN INTEGRATED CIRCUIT DICING DEVICE

(75) Inventor: Hae Choon Yang, Singapore (SG)

(73) Assignee: Rokko Systems Pte Ltd., Singapore (SG)

( * ) Notice: Subject to any disclaimer, the term of this patent is extended or adjusted under 35 U.S.C. 154(b) by 0 days.

(21) Appl. No.: 12/895,342

(22) Filed: Sep. 30, 2010

(65) Prior Publication Data

US 2011/0021003 A1    Jan. 27, 2011

Related U.S. Application Data

(62) Division of application No. 11/660,940, filed as application No. PCT/SG2005/000288 on Aug. 23, 2005, now Pat. No. 7,829,383.

(30) Foreign Application Priority Data

Aug. 23, 2004  (SG) ................................ 200405166-0
Mar. 22, 2005  (SG) ................................ 200501802-3

(51) Int. Cl.
    *H01L 21/00*    (2006.01)
(52) U.S. Cl. .. 438/113; 438/464; 438/460; 257/E21.327
(58) Field of Classification Search .................. 438/460, 438/464, 113; 257/E21.327
    See application file for complete search history.

(56) References Cited

U.S. PATENT DOCUMENTS

| 4,407,262 | A | 10/1983 | Wirz et al. |
| 4,688,540 | A | 8/1987 | Ono et al. |
| 5,953,590 | A | 9/1999 | Piper et al. |
| 6,196,532 | B1 | 3/2001 | Otwell |
| 2001/0007253 | A1 | 7/2001 | Saito |
| 2003/0159528 | A1 | 8/2003 | Kim et al. |
| 2003/0203538 | A1 | 10/2003 | Peng et al. |
| 2007/0184646 | A1 | 8/2007 | Nakagawa et al. |

FOREIGN PATENT DOCUMENTS

| JP | 6-47220 | 2/1994 |
| JP | 2003-163178 | 6/2003 |
| JP | 2005-158983 | 6/2005 |
| KR | 2002-0049954 | 6/2002 |
| KR | 10-2004-0044087 | 5/2004 |
| KR | 10-2004-0085280 | 10/2004 |
| KR | 10-2006-0063318 | 6/2006 |
| WO | WO-01/85367 | 11/2001 |
| WO | WO-03/095169 | 11/2003 |
| WO | WO-2004/053967 A1 | 6/2004 |
| WO | WO-2005/062375 A2 | 7/2005 |
| WO | WO-2005/109492 A1 | 11/2005 |

*Primary Examiner* — Thanh V Pham
*Assistant Examiner* — Mark A Laurenzi, III
(74) *Attorney, Agent, or Firm* — Dickstein Shapiro LLP

(57) ABSTRACT

A system for dicing substrates to singulate integrated circuit units within in them includes a dicing machine (Z) which operates with a chuck table (4). A lifting assembly (Ax,Ay) deposits substrates to be singulated onto the chuck table (4) at substantially the same time as it removes previously singulated units from the chuck table (4).

5 Claims, 23 Drawing Sheets

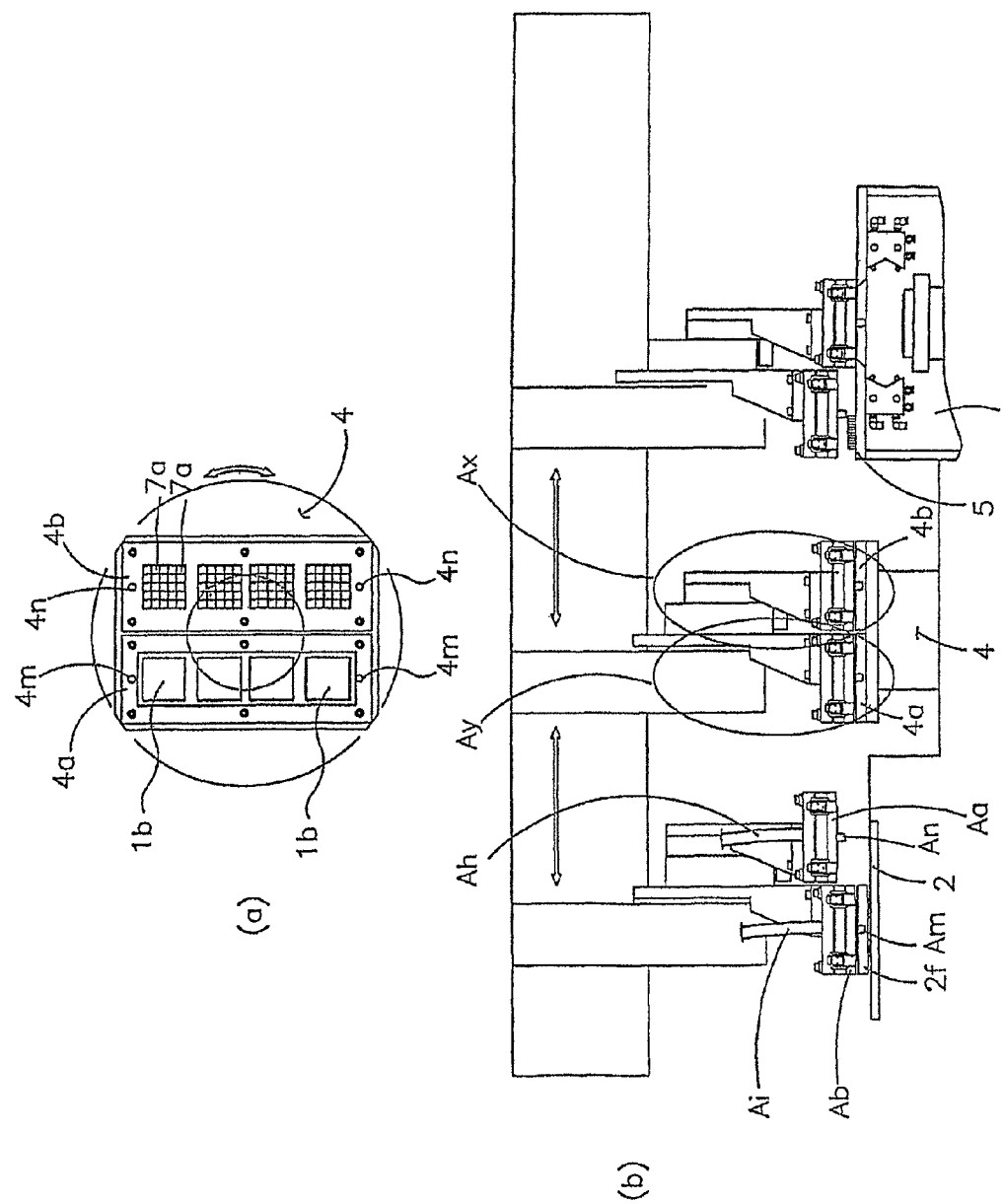

US 7,939,374 B2

SUPPLY MECHANISM FOR THE CHUCK OF AN INTEGRATED CIRCUIT DICING DEVICE

This is a divisional of U.S. application Ser. No. 11/660,940, filed Feb. 23, 2007 now U.S. Pat. No. 7,829,383, which is a 371 of PCT/SG2005/000288, filed Aug. 23, 2005, the entire disclosures of which are hereby incorporated by reference.

FIELD OF THE INVENTION

The present invention relates to a sawing and sorting system. The system interacts with, or includes, a dicing machine which saws ("dices") a substrate with many integrated circuits formed onto it to form individual integrated circuits. The invention further relates to apparatus for use in such a sawing and sorting system.

BACKGROUND OF INVENTION

Conventionally a plurality of integrated circuits are formed simultaneously on a semiconductor substrate, and the substrate is then diced to form individual integrated circuits. Apparatus is know for feeding substrates into such a dicing machine, and for sorting the diced integrated circuits.

One type of integrated circuit which is becoming increasingly popular is one having an array of multiple electrical contacts (typically solder balls, known as a ball grid array packages, and pads in non-leaded packages, known as a Quad Flatpack Non-Leaded (QFN) packages) in an array on one of its major faces. The dicing of a substrate having a ball grid array on one of its surfaces is typically performed with the surface of the substrate carrying the balls facing upwards. It is known to perform a limited number of sorting operations on the singulated integrated circuit units to detect abnormal (faulty) units. This is performed using cameras under which the singulated units pass. The level of sophistication of such techniques is presently limited. In particular, it tends to be performed on the basis of a batch of units produced from the same substrate, and that batch of units is rejected as a whole if a fault is identified (e.g. because it is discovered that the alignment of the substrate with the lines cut by the dicing machine is not sufficiently accurate).

During this process, the units are handled by devices which touch the integrated circuits at the edges of their upper surfaces, at the margins which are outward of the area of the upper surfaces covered by the ball grid array. Contacting the circuits there reduces the risk of damage being done to the array of balls. However, this handling operation is a difficult one, and is becoming increasingly more difficult as the size of the integrated circuits falls and the margin around the ball grid array shrinks.

SUMMARY OF THE INVENTION

The present invention aims to provide a new and useful system for supplying substrates to a dicing machine.

It further aims to provide a new and useful dicing system including a mechanism for supplying integrated circuits to the dicing machine.

In a first aspect, the invention provides a substrate delivery and chuck system for co-operation with a dicing machine, the system including a chuck table having two chuck sections; a drive mechanism for moving the chuck sections between a first location and a second location; and a lifting assembly for substantially simultaneously (i) depositing a first substrate onto a first of said chuck sections when the first chuck section is in the first location, and (ii) picking up singulated units of a previously diced substrate from a second of the chuck sections when the second chuck section is in the second location; the chuck table and drive mechanism being operable (i) to co-operate with the dicing machine to dice a substrate placed in a said chuck section at the first location, and (ii) to move that chuck section to the second location.

In a second aspect, the invention provides a system for dicing integrated circuits to form singulated units, the system including a dicing machine; a chuck table having two chuck sections; a drive mechanism for moving the chuck sections between a first location and a second location; and a lifting assembly for substantially simultaneously (i) depositing a first substrate onto a first of said chuck sections when the first chuck section is in the first location, and (ii) picking up singulated units of a previously diced substrate from a second of the chuck sections when the second chuck section is in the second location; the chuck table, drive mechanism and dicing machine being operable to dice a substrate placed in a said chuck section at the first location, and to move that chuck section to the second location.

In a third aspect, the invention provides a method of singulating integrated circuit units formed within substrates, the method including depositing a first substrate on a chuck table at a first location; operating a dicing machine to dice the first substrate, and a drive mechanism to move the chuck table to move the diced first substrate to a second location; and substantially simultaneously (i) picking up the diced first substrate from the chuck table at the second location; and (i) depositing a second substrate on the chuck table at the first location.

The term "substantially simultaneously" is used to mean on a time scale much shorter than that on which the lifting assembly performs the operation in which substrates are picked up and deposited. One possible of the term "substantially simultaneously" is that the release of one substrate occurs within 2 seconds (or more preferably one second) of the time at which the singulated units are picked up. Alternatively, in the case that the substrate and singulated units are retained on the lifter unit by suction, the term "substantially simultaneously" may imply that the time during which the suction force applied to the singulated units is rising overlaps with the time during which the suction applied to the singulated is falling.

Typically, the chuck table may comprise two sections: a first section for receiving a substrate to be singulated, and a second section from which the singulated units can be removed. The chuck table is preferably rotatable to bring the first section into the position of the second section.

Preferably the lifting assembly includes a frame lifting member having a surface for receiving a substrate, and a net lifting member having a surface for receiving singulated units. The frame lifting member and net lifting member move together in at least one direction in the plane of the chuck table, but preferably are independent movable in the direction towards and away from the surface of the chuck table. The lifting assembly is operable to descend onto the chuck table while carrying a substrate in the frame lifting section, and substantially simultaneously to deposit the substrate in the first section of the chuck table and to remove the singulated units from the second section of the chuck table.

The lifting assembly may include guide elements which cooperate with guide elements provided on the chuck table for positioning the both the frame lifting member and net lifting member as the lifting assembly approaches the chuck table. In one form, at least one of these guide elements takes the form of a projection, and at least one of the guide elements takes the form of a recess for receiving the projection.

The lifting assembly comprises at least one vacuum source and one or more apertures in the frame lifting member and net lifting member which can be brought into communication with the vacuum source, to generate a suction for urging the substrate and/or the singulated units against the respective surfaces of the frame lifting member and net lifting member.

The lifting assembly may be configured to operate with substrates which include multiple panels, each composed of a plurality of integrated circuits to be singulated. The integrated circuits are preferably of the type having an array of electrical contacts, such as a ball-grid array or array of pads. Preferably, the substrate is diced at a time when the array of electrical contacts is facing towards the chuck table.

The lifter assembly preferably moves in a loop including a first position in which it lifts a first substrate, the chuck table in which it deposits the first substrate and picks up the singulated units from a previously diced second unit, and a deposit position in which it deposits the singulated units.

Preferably, between the chuck table and the deposit position the lifting assembly moves through one or more stages in which the singulated units are treated (e.g. cleaned). These stages may include a stage in which the singulated units are subjected to a brushing action, and a cleaning stage in which the singulated units are subject to a cleaning action using a fluid. Preferably, in the cleaning stage the net lifting member is inserted into a cleaning position in which singulated units located on the net lifting member are cleaned using the fluid. Preferably at this stage the frame lifting member is not exposed to the fluid.

Preferably, the lifter assembly may be arranged to move in a loop including a first position in which it collects a first substrate, a position proximate the chuck table in which it deposits the first substrate and picks up the singulated units from a previously diced second unit, and a deposit position in which it deposits the singulated units.

In a preferred embodiment the system may include one or more treatment units for treating the singulated units. In a more preferred embodiment, one of said treatment units may be a brushing unit.

In a still further preferred embodiment, one of said treatment units may be a fluid cleaning unit, which cleans the singulated units when a portion of the lifter assembly supporting the singulated units is located in a cleaning location.

In a preferred embodiment, the integrated circuit units may include an array of electric contacts which face away from the chuck table during the dicing operation.

In a fourth aspect, the invention provides a substrate delivery and chuck system for co-operation with a dicing machine, the system including:
a chuck table having two chuck sections; a drive mechanism for moving the chuck sections between a first location and a second location; and a lifting assembly for substantially simultaneously (i) depositing a first substrate onto a first of said chuck sections when the first chuck section is in the first location, and (ii) picking up singulated units of a previously diced substrate from a second of the chuck sections when the second chuck section is in the second location; the chuck table and drive mechanism being operable (i) to co-operate with the dicing machine to dice the first substrate placed on the first chuck section at the first location, and (ii) to move the first chuck section to the second location.

In a fifth aspect, the invention provides a support device for supporting a set of integrated circuit units, the device comprising a support frame, said frame having an array of recesses; a soft material insert, adapted to fit within the support frame, said insert having an array of apertures placed so as to correspond with the recesses of the frame when said insert is fit within said frame; a vacuum means in communication with each of said recesses and apertures; wherein each unit of the set corresponds to an aperture of the insert and is held in place by the vacuum.

In a preferred embodiment, the substrate may comprise one or more discreet panels, whereby each panel comprises a plurality of said units ready to be diced and singulated by the system. Thus, system according to the invention is adaptable for use for substrates having several panels or for a substrate, which in itself, may be a single panel. The system may embrace both a batch process whereby a substrate may have several panels, each containing many units or approximating a continuous process whereby the system processes a single panel and thus reducing the residence time of the substrate within the system.

The system may be applicable to a range package sizes, from the smallest of QFN package design 1×1 to the largest available packages of 15×15. This should not restrict the scope of the invention for future available packages which may be equally suited to the system of the present invention, but are yet to be made commercially available.

In a preferred embodiment, the system may further include a separating device upstream from the chuck table. Said separating device may be adapted to receive a substrate of many panels and, based upon a predetermined number of panels to be entered into the chuck table for dicing, separate the predetermined number of panels from the original substrate.

In a more preferred embodiment, the separating device may have an optical identification system, whereby the system identifies when the predetermined number of panels have passed a cutting portion of the separating device, which controls the system to receive the information from the identification system and instruct the cutter to cut the original substrate, thus create a new substrate having the predetermined number of panels. Said predetermined number may be anywhere from one upwards and may be a function of the size of the chuck table or other physical parameters. Alternatively, the number may be influenced by the economics of the numbers of units per hour that are required.

In an preferred embodiment where the substrate may be a single panel or at least a small number of panels, there may be distinct advantages in handling the smaller number of panels. For instance, for a given vacuum arrangement, the smaller the number of panels, the greater the available suction which may be of particular use during the cutting action. In any event, smaller number of panels may be more stable and so increase the quality of the cutting activity, particularly in relation to the packaging size or if an offset cut is required.

For a system adapted for use with a smaller number of panels such as a single panel, the cost of converting an existing arrangement is reduced and therefore a conversion kit may become economically viable in order to maintain the system.

For a continuous process or where the system emulates a continuous process by processing a smaller number of panels at one time, may minimize wastage should a cutting mistake occur. For instance, if a cutting mistake occurs as a result of a one-off event, then the losses involved with one panel will be less than if a substrate of many panels were involved.

In a sixth aspect, the invention provides a method for dicing substrates to produce sorted singulated units, comprising the steps of loading said substrates to a rail system; delivering said substrates via the rail system to a chuck table arrangement for dicing said substrates; dicing said substrates to produce singulated units held within a predetermined spatial arrangement; flipping said substrates whilst maintaining the predetermined spatial arrangement; delivering the singulated units to a net block assembly to separate and control individual units, and; sorting and categorizing the individual units so as to separate them by efficacy.

Therefore, the invention provides a complete system to receive a strip of integrated circuits at the front end, and deliver sorted singulated units ready for use, reworking and rejection. The system may be embodied within a unitary device, or alternatively within a modular construction, with each step connected through a delivery means.

In a preferred embodiment the dicing step may further include loading the substrates to a plurality of chuck tables located on tracks, passing the chuck tables along said tracks passed respective cutting means, singulating units from the substrates using the cutting means, and maintaining the relative position of the singulated units within the predetermined spatial arrangement corresponding to their position within the substrate prior to singulation.

With the commercial success of such systems significantly influenced by the Units per Hour (UPH) rate, embodiments which assist in the increasing the UPH have a significant advantage over the prior art. Thus, the system for this embodiment, the dicing station may include a plurality of chuck tables, and so be able to accept a plurality of strips.

In a further preferred embodiment the system may have a plurality of tracks, each supporting at least one chuck table.

In a more preferred embodiment, each track may support a plurality of chuck tables.

In a further embodiment, individual chuck tables may undergo the loading, passing, singulating and maintaining steps in a staggered sequence so as to minimize delay time between these steps.

Further increasing the UPH, this embodiment provides a staggered process

In a preferred embodiment, the singulated units delivered to the net block assembly are placed upon at least one net block. Alternatively, there may be a plurality of net blocks.

In a more preferred embodiment, each net block may be located on an individual track. Alternatively, each track may support and transport a plurality of net blocks.

In a still further embodiment the step of sorting and categorizing includes determining whether each singulated unit falls within the category of efficacious, non-efficacious or whether the singulated unit requires re-working.

In a seventh aspect the invention provides a system for dicing substrates to produce sorted singulated units, comprising cassettes for loading said substrates to a rail system, the rail system being in communication with a chuck table arrangement; said chuck table arrangement adapted to dice the substrates into singulated units held within a predetermined spatial arrangement; a flipper for flipping said substrates whilst maintaining the predetermined spatial arrangement; a net block assembly to separate and control individual units, and; a sorting and categorizing means for separating the singulated units by efficacy.

In a preferred embodiment the chuck table arrangement may include a plurality of chuck tables on to which are loaded the substrates, cutting means for singulating the units from the substrates, and holding means for maintaining the relative position of the singulated units within the predetermined spatial arrangement corresponding to their position within the substrate prior to singulation.

In a further preferred embodiment each chuck table may be located on a respective track for movement of the chuck table, and consequently the substrate, independently from the other chuck tables.

In a more preferred embodiment the chuck table arrangement may be adapted to permit the loading of a substrate on one chuck table as an independent function from cutting of a substrate on another chuck table.

In a preferred embodiment at least two chuck tables may be located on the respective track for movement of the chuck tables, and consequently the substrate, independently from the other chuck tables.

In a more preferred embodiment, the chuck table arrangement may be adapted to permit the loading of substrates on the at least two chuck tables as an independent function from cutting of substrates on the another chuck tables.

In a more preferred embodiment, the cutting means may include any one or a combination of laser cutting, water jet cutting or blade cutting.

In a still further preferred embodiment, blade cutting may include the use of at least one gang blade located on a single spindle In a further embodiment, the cutting means may include a plurality of spindles, each having a gang blade of multiple blades for increasing the rate of dicing of the substrates.

In a still further preferred embodiment, at least one spindle may be associated with a respective track. Alternatively, each track may have associated with it a plurality of spindles, possessing at least one blade per spindle, or possibly a plurality of blades in a gang blade arrangement.

BRIEF DESCRIPTION OF THE DRAWINGS

Preferred features of the invention will now be described, for the sake of illustration only, with reference to the following figures in which:

FIG. 4, which is composed of FIGS. 4(a) and 4(b), shows a section of the embodiment of FIG. 1 including a twin chuck table;

DETAILED DESCRIPTION OF THE EMBODIMENTS

Figure 1A:
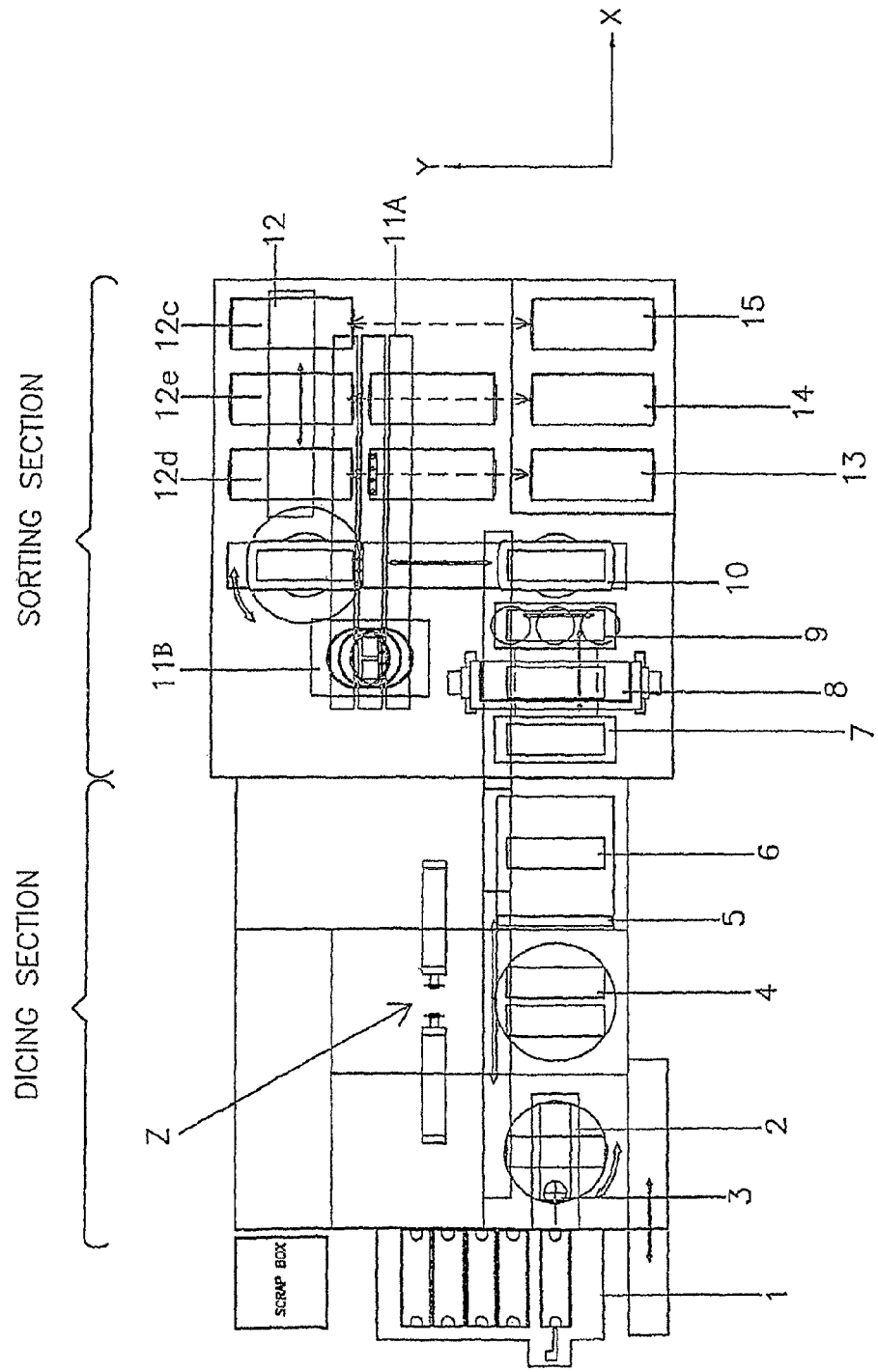
FIG. 1(a) is a top view of an integrated circuit sawing and sorting system according to a first embodiment of the invention.

FIG. 1(a) shows the overall construction of an integrated circuit sawing and sorting system which is an embodiment of the invention. In FIG. 1(a) the system is viewed from above. It is composed of two sections, a dicing section and a sorting section. Two horizontal directions are marked X and Y.

The sawing and sorting system is for sawing and sorting substrates which include a plurality of integrated circuits. The system is particularly suitable for integrated circuits each of which is provided with an array of contacts on a side of the substrate which is initially facing upwards (however the system may be modified for other sorts of integrated circuits, as described below). The substrates are inserted into the system from cassettes using a loader assembly 1. From the loader assembly 1 the substrates are carried to an inlet rail assembly 2. At this stage the substrates are examined using a first camera 3, mainly to check that the substrates are of a type suitable for use in the sawing and sorting system.

As described in detail below, the substrates pass to a twin chuck table 4, from which they are carried into a dicing machine indicated generally as Z. This dicing machine Z can be formed according to known designs, and so will not be described here in detail.

The diced substrates pass via a brush unit 5 where the singulated units are brushed, and a cleaner unit 6, to a heating block assembly 7. From there, the units pass to a flipper unit 8, where, as described in detail below, the units are turned over so that each ball grid array faces downwards. The singulated units are then received by an idle unit assembly 9, including a second camera. Subsequently, the singulated units pass to a net block assembly 10.

Figure 1B:
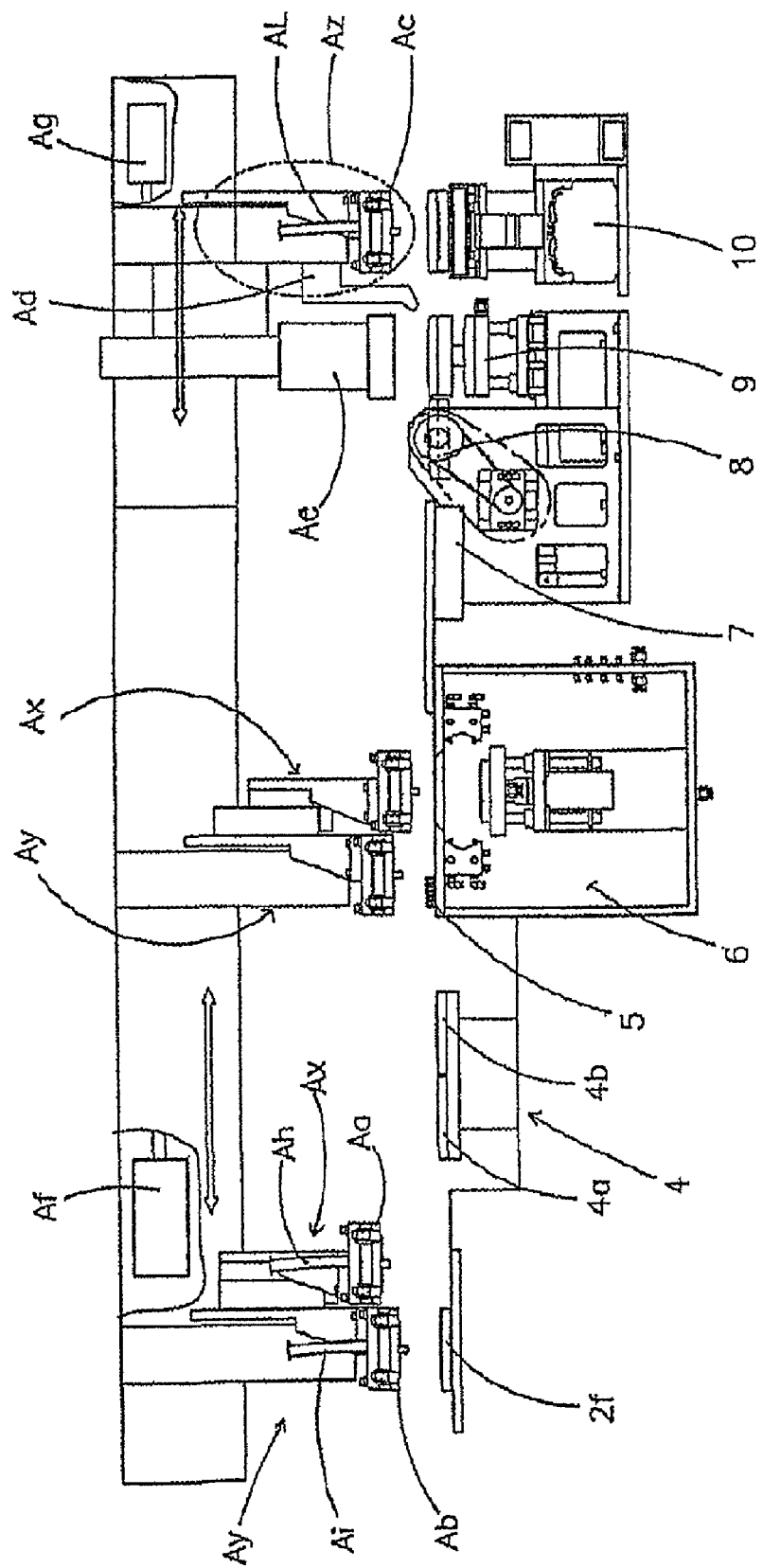
FIG. 1(b) is a side view of a part of the embodiment of FIG. 1 looking in the direction Y shown in FIG. 1.

FIG. 1(b) shows the portions 2 to 10 of this system from the direction marked A in FIG. 1(a). A frame lifter assembly indicated having portions Ay and Ax is shown in two different positions which it successively adopts during the use of the system.

The singulated units are picked up from the net block assembly 10 by a lifter assembly 11A. They are then inspected by a ball vision inspection camera assembly 11B which examines them from beneath. A computer system uses the data obtained at this step to make a determination of the quality of the units, and accordingly controls the lifter assembly 11A to place them into one of two trays 12d, 12e. A vacant tray is kept at position 12c. Once filled, the trays 12d, 12e are moved (in the direction which is downwards in FIG. 1(a)) respectively into a normal unit tray stacking assembly 13 and an abnormal unit tray stacking assembly 14. A tray lifter assembly 12 moves a vacant tray from position 12c to replace whichever of trays 12d, 12e has been removed. A new vacant tray is moved to position 12c from a vacant tray stacking assembly 15.

We now discuss the various sections of the embodiment in detail.

Figure 2:
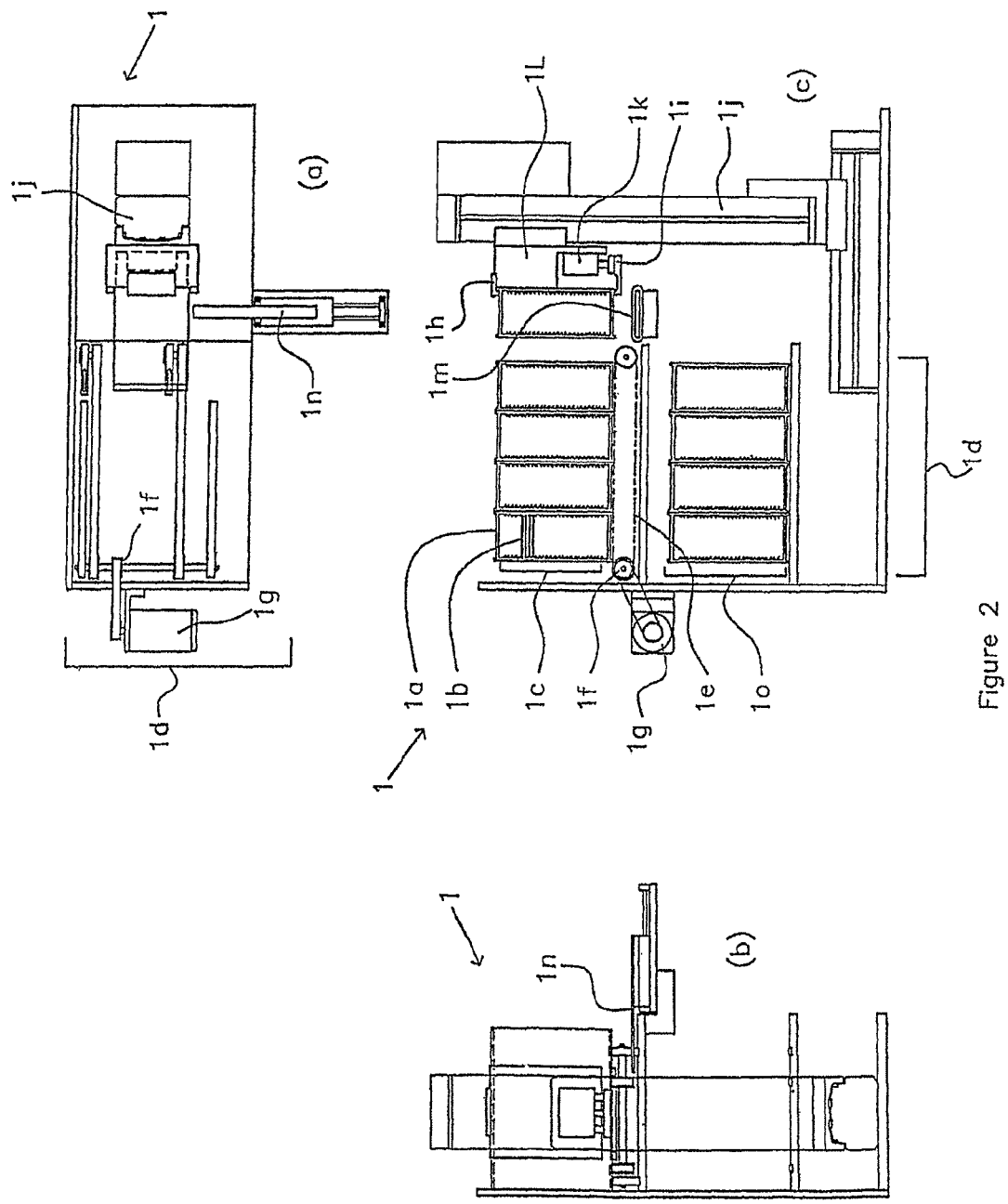
FIG. 2, which is composed of FIGS. 2(a) to 2(c), shows a loader assembly of the embodiment of FIG. 1.

The loader assembly 1 is shown in FIG. 2(a) in top view, in FIG. 2(b) in side view in the direction Y in FIG. 1(a), and in FIG. 2(c) in side view in the direction X in FIG. 1(a). The loader assembly 1 includes a number of cassette magazines 1a in a region 1d of an upper stage 1c of the load assembly 1. The cassette magazines each contain a number of stacked substrates, each including a number of panels 1b (typically each panel is identical, and is designed in view of the uses which are to be made of the singulated integrated circuits; there may be 2, 3, 4 or 5 panels in a single substrate). At least one cassette magazine 1a is fed at a time to the loader assembly 1. Once each magazine 1a has been loaded, it is carried (in the direction towards the right in FIG. 2(c)) towards a magazine gripper 1h, 1i by a wide rubber belt 1e driven by rollers 1f and a motor 1g. The magazine gripper 1h, 1i is composed of a lower gripper 1i and an upper gripper 1h. The magazine gripper 1h, 1i is installed on an up/down linear rail 1j via a gripper block 1L.

As soon as the cassette magazine 1a has been transferred to the magazine gripper 1h, 1i, the lower gripper 1i is activated by a cylinder 1k to push the magazine upward. This positions the cassette magazine 1a firmly between the lower gripper 1a and the upper gripper 1h.

The magazine gripper 1h, 1j is then lowered along the up/down linear rail 1j, until one of the substrates is in register with a substrate slot 1m. The substrate is pushed into the substrate slot 1m by a pusher 1n. The magazine gripper 1h, 1j is then moved to bring another of the substrates in the cassette magazine 1a into register with the substrate slot 1m. In this way, all the substrates in the cassette magazine 1a are sequentially transferred to the slot 1m.

Once the substrate loading is complete, the empty magazine 1a is shifted downward, and the magazine gripper 1h, 1i releases it from the up/down linear rail 1j. The empty magazines are placed onto a lower stage 1o of the region 1d of the loader assembly 1.

The inlet rail assembly 2 is shown in FIG. 3(a) in top view, in FIG. 3(b) in side view looking in the direction Y in FIG. 1(a), and in FIG. 3(c) in side view looking in the direction opposite to X in FIG. 1(a). The substrate is pushed by the pusher 1n until it is positioned at the roller 2a. At this location, the substrate 1b is inspected by the first camera 3. The image taken by the first camera 3 is analyzed by a computer system, to establish that the substrate is the correct package type, to check its alignment and its orientation. If it is detected that the substrate is the wrong type for example, the progression is automatically stopped, then the substrate can be removed from the system (e.g. manually).

After the visual inspection by the first camera 3, the roller 2a is rotated to move the substrate onto a rail supporter 2f until it reaches a stopper 2b. The rail supporter is has a generally rectangular upper surface, and at this time the long axis of the upper surface is in the horizontal direction on FIG. 13(a).

During this process, the spacing of the inlet rails 2c is aligned using a servo-motor 2d and belt 2e. Once a substrate (which in FIG. 3(a) is shown including four panels 1b) is located over the rail supporter 2f, the rail supporter 2f, which is linked with an up/down air cylinder 2g lifts the substrates 1b upwards, out of the horizontal level of the inlet rails. Then a servo motor 2*h* and belt 2*i* rotate the rail supporter 2*f*, and thereby rotate the substrates 1*b*. The rotation is through 90° or 270° in a horizontal plane, in order that the substrates should be correctly aligned with the twin chuck table discussed below. This rotation means that the substrates can initially have their long axis in the X direction, but are rotated so that their long axis extends in the Y direction, in which the dicing machine Z is arranged to receive them.

Once the substrate is rotated by the frame supporter 2*f*, the substrate is lifted from the frame supporter 2*f* by a frame lifter assembly. The frame lifter assembly has two portions labelled (in FIG. 1(*b*)) respectively as Ay and Ax, which are independently movable in a vertical direction, and horizontally movable together (in the left-right direction as viewed in FIG. 1(*b*)) by a servo-motor Af. The portion Ay includes a frame lifting member Ab, for lifting the substrate supported on the frame supporter 2*f*, and the portion Ax includes a net lifter member Aa, which is explained below. The frame lifting member Ab is connected via a conduit Ai to a vacuum source for generating a force for retaining the substrate against the frame lifter member Ab. Typically, the frame lifting member Ab includes a number of apertures on its face communicating with the conduit Ai. A switch mechanism (not shown) determines whether the vacuum source is activated (i.e. applies negative pressure to the apertures) or deactivated (e.g. because it is no longer in communication with the apertures).

After the frame lifter member Ab has picked up a first substrate from the frame supporter 2*f*, the frame supporter 2*f* returns to its pervious orientation and height, so that it can receive a new substrate. The operation of lifting and rotating is then performed for the new substrate.

The frame lifter assembly transfers the substrate to a frame loading position of the twin chuck table 4. The twin chuck table 4 is shown in top view in FIG. 4(*a*), and in FIG. 4(*b*) looking in the direction Y of FIG. 1(*a*). It is arranged to be capable of rotation around a vertical axis, and includes two identical sections 4*a*, 4*b*, which are interchanged by the rotation. The frame lifter member Ab of the frame lifter assembly places the substrate at a time into the section 4*a* on the left side as shown in FIG. 4. There the substrate is retained by suction using apertures in the chuck table which can be put into communication with a vacuum source. The members Aa and Ab each have projections Am, An at their ends, for entering corresponding apertures 4*m*, 4*n* on the chuck table 4, thereby ensuring correct positioning. The twin chuck table 4 is arranged to co-operate with a dicing machine of a known design, which dices the cassette. During the dicing, each substrate 1*b* is cut into singulated units 7*a*. Following the dicing the chuck table rotates 180° about its central vertical axis so as to bring the singulated units 7*a* to position of the on the right side as shown in FIG. 4 (i.e. the one formerly occupied by the section 4*b*). The section 4*b* moves simultaneously into the position formerly occupied by the section 4*a*.

Simultaneously with the operation in which the frame lifter member Ab deposits a new substrate into the section 4*a*, the net lifter member Aa is lowered to contact the singulated units 7*a* of a previously diced substrate 1*b*. The net lifter member Aa contains apertures in its lower surface which are in communication with a vacuum source via a conduit Ah, so that the net lifter member Aa retains the singulated units 7*a*. The suction on the singulated units from the apertures in the chuck table is turned off. The frame lifter assembly then moves away from the twin chuck table 4, so that the twin chuck table 4 can cooperate with the dicing machine to dice the substrate 1*b* which has just been deposited. Thus, the time during which the twin chuck table cooperates with the frame lifter assembly is efficiently used, both for the deposition of a new substrate and the removal of one which has already been diced. Thus, the throughput of the dicing machine is optimized, with as little time as possible wasted in loading and unloading a chuck table.

Figure 6:
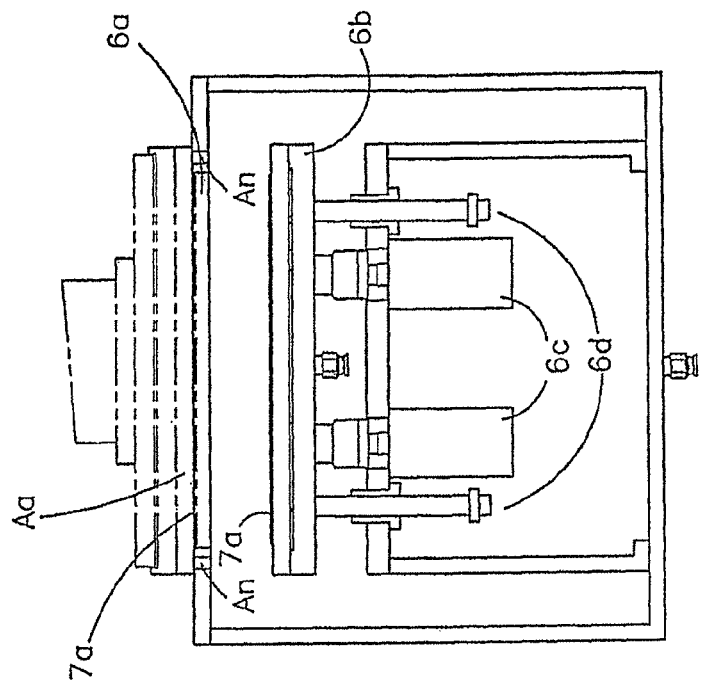
FIG. 6 is a second view of the cleaner unit of the embodiment of FIG. 1.
Figure 5:
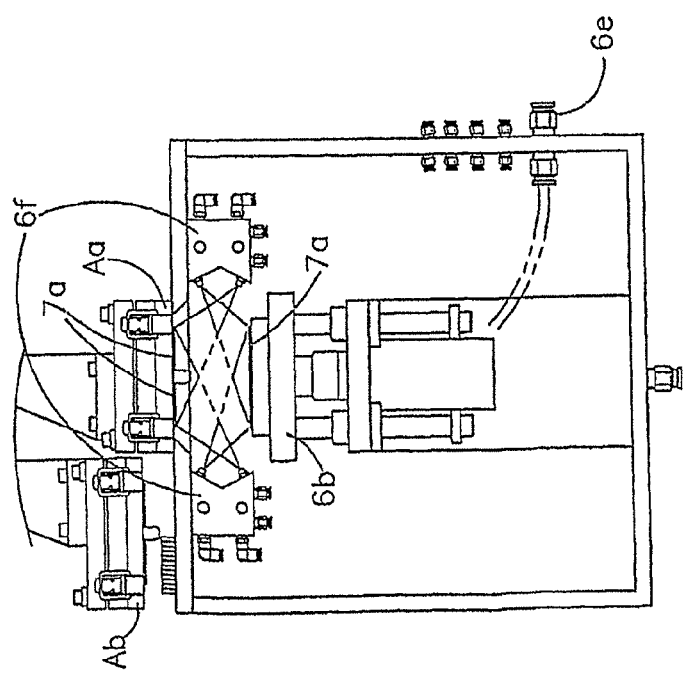
FIG. 5 is a first view of a cleaner unit of the embodiment of FIG. 1.

The net lifter member Aa lifts the singulated units 7*a* to the brush unit 5 which cleans them by a rubbing motion. The net lifter member Aa then moves the singulated units 7*a* to a cleaner unit 6, shown in FIG. 5 in a view looking in the direction Y, and in FIG. 6 in a view looking in the direction opposite to X. The net lifter member Aa lowers until the units enter a cleaning zone 6*a*. The projections 4*n* enter respective apertures at the top of the cleaning unit 6.

Simultaneously, a frame supporter 6*b* inside the cleaner unit 6 is raised by pneumatic cylinders 6*c* and guide posts 6*d*, until it touches the lower surface of the singulated units 7*a*. A vacuum source is put into communication via a conduit with apertures in the upper surface of the frame supporter 6*b* respectively in register with the singulated units 7*a*, so as to retain the singulated units 7*a* on the frame supporter 6*b*. The pneumatic function of the net lifter member Aa is turned off.

The frame supporters 6*b* then moves down, and water and air jets 6*f* are initiated to remove dust and debris from the surface of the singulated units 7*a* which is facing upwardly (recall that this is the surface having the ball contacts).

After the surfaces of the singulated units 7*a* carrying the balls have been cleaned, the water and/or air jets 6*f* are deactivated. The frame supporter 6*b* moves upward again, until the singulated units 7*a* are again against the net lifter member Aa. The vacuum source is again initiated using the conduit Ah, and the vacuum source of the frame supporter 6*b* is disconnected. At this point the singulated units 7*a* are again retained on the lower surface of the net lifter member Aa. The water and air jets 6*f* are activated again, and clean the other surface of the singulated units 7*a* (i.e. the side away from the ball grid array).

Figure 7:
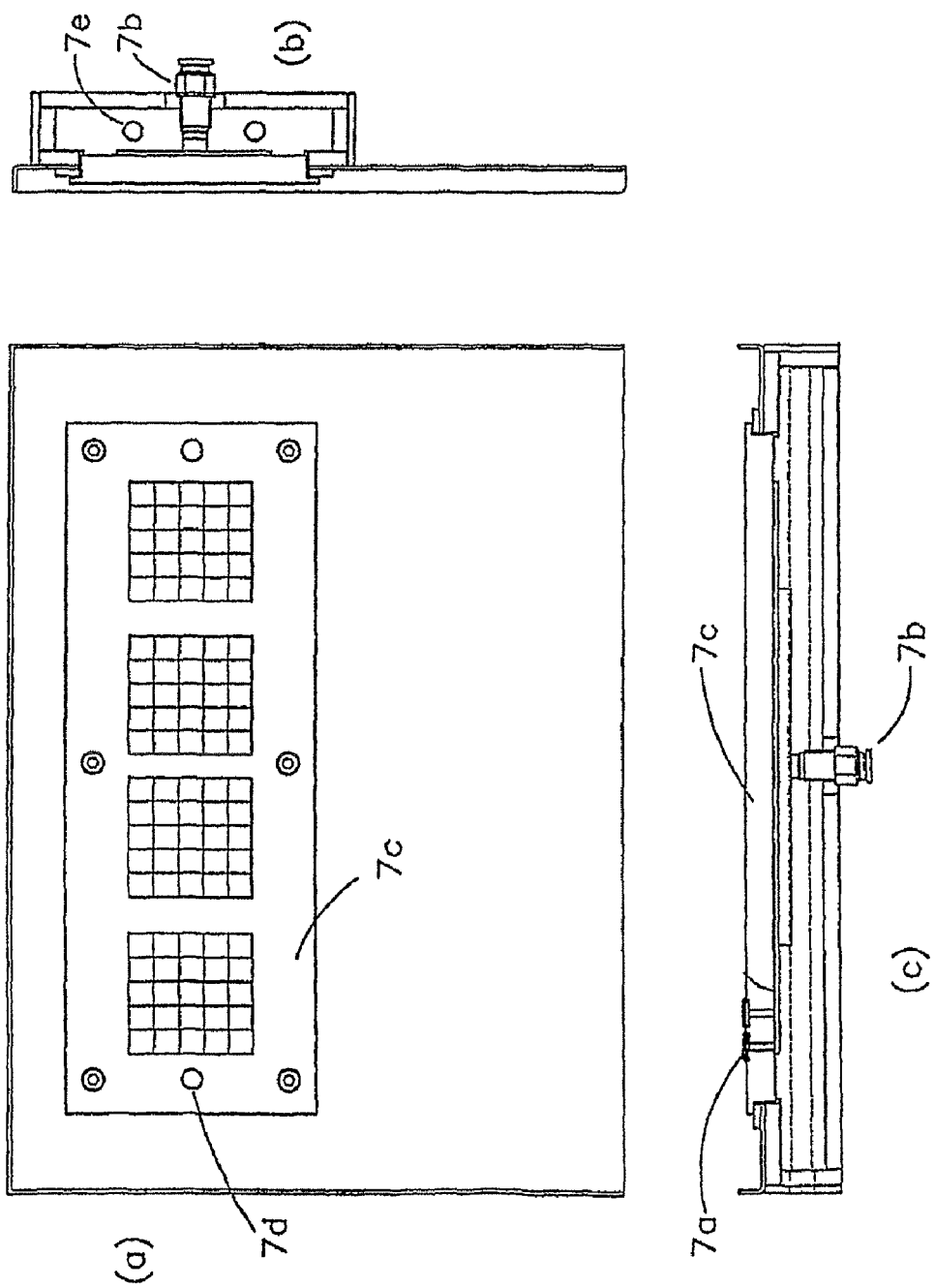
FIG. 7, which is composed of FIGS. 7(a) to 7(c), shows a heating block assembly of the embodiment of FIG. 1.

After the cleaning, the net lifting member Aa lifts the singulated units 7*a* and moves them to the upper surface of a heating block 7*c* of the heating block assembly 7. The heating block assembly 7 is shown in top view in FIG. 7(*a*), in cross-section when viewed from direction A in FIG. 7(*b*), and in cross-section when viewed in direction B in FIG. 7(*c*). At this moment, the net lifting member Aa and the heating block 7*c* are aligned by the projections An entering apertures 7*d*, so that the singulated units 7*a* are properly positioned in predetermined positions on the heating block 7*c*.

Once the singulated units 7*a* are in contact with the heating block 7*c*, the suction from the conduit Ah is deactivated, and suction is applied via a conduit 7*b* which is in communication with apertures in the upper surface 7*c* in register with the singulated units 7*a*, so as to hold the singulated units 7*a* on the heating block 7*c*.

At this point the frame lifter assembly is not carrying either substrates or singulated units), and the frame lifter assembly returns to its position over the inlet rail assembly 2. The time taken by dicing machine to dice the substrates 1*b* is preferably at least as great as the time taken by the frame lifter assembly to perform the set of actions: (i) moving from the twin chuck table 4 to the heating block assembly 7, (ii) returning to the inlet rail assembly, and (iii) picking up a new substrate(s) 1*b* (i.e. all portions of the operation of the lifter assembly except that in which it interacts with the table 4). Provided this is true, then the speed of operation of the dicing machine is not reduced by the time the head lifting assembly takes to interact with the other units.

Any drops of water on the singulated units 7*a* are evaporated by heat generated by a cartridge heater 7*a* of the heating block assembly 7. The system further includes an idle lifter assembly (indicated generally as Az in FIG. 1(b)) which is reciprocated (left-right in FIG. 1(b)) by a servo-motor Ag. This idle lifter assembly includes a nozzle Ad. The idle lifter assembly Az is moved so that the nozzle Ad is directed at the singulated units 7a, and the nozzle Ad blows air at the singulated units 7a to dry the units, especially at the top.

Figure 8:
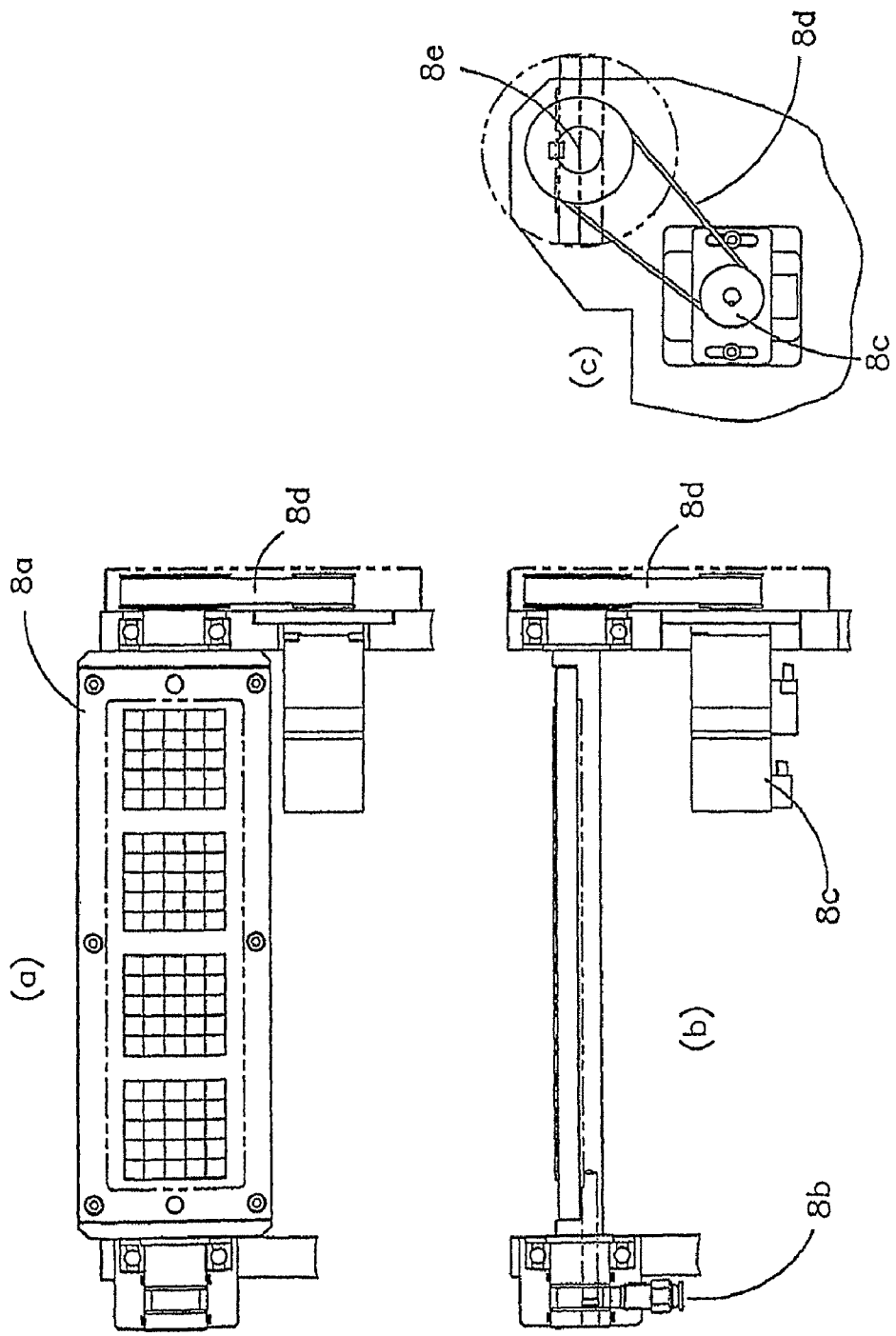
FIG. 8, which is composed of FIGS. 8(a) to 8(c), shows a flipper unit of the embodiment of FIG. 1.

The idle lifter assembly Az includes an idle lifter Ac which can be raised and lowered, and which includes apertures on its lower surface in communication with a vacuum source via a conduit AL. The idle lifter Ac is lowered over the singulated units 7a, and the vacuum source activated so that the singulated units are retained on the lower surface of the idle lifter Ac. The idle lifter Ac is then raised, moved horizontally (to the right in FIG. 1(b)), and then lowered onto a horizontal surface of a flipper block 8a of the flipper unit 8. The flipper unit 8 is shown in top view in FIG. 8(a), and in FIG. 8(b) looking in the direction X. A portion of the flipper unit is shown in FIG. 8(c) looking in the direction Y. The flipper block 8a is a body having two opposed flat surfaces, each containing apertures in communication with a vacuum source via a conduit 8b. Once the singulated units 7a are placed on the upper surface of the flipper bock 8a, the vacuum source of the idle lifter Ac is deactivated, and the vacuum source of the flipper unit 8 activated so that the singulated units 7a become attached to the upper surface of the flipper block 8a.

While this attachment continues, the flipper block 8a is rotated about a horizontal axis 8e through its center (into the page in FIGS. 1(b) and 8(c)) so that the surface of the flipper block 8a which formerly faced upward, now faces downward. The rotation of the flipper block 8a is performed by a servo motor 8c, which is linked to the flipper block by a rubber belt 8d. Note that the ball grid arrays, which until this time have been facing upwards, now face down.

Figure 9:
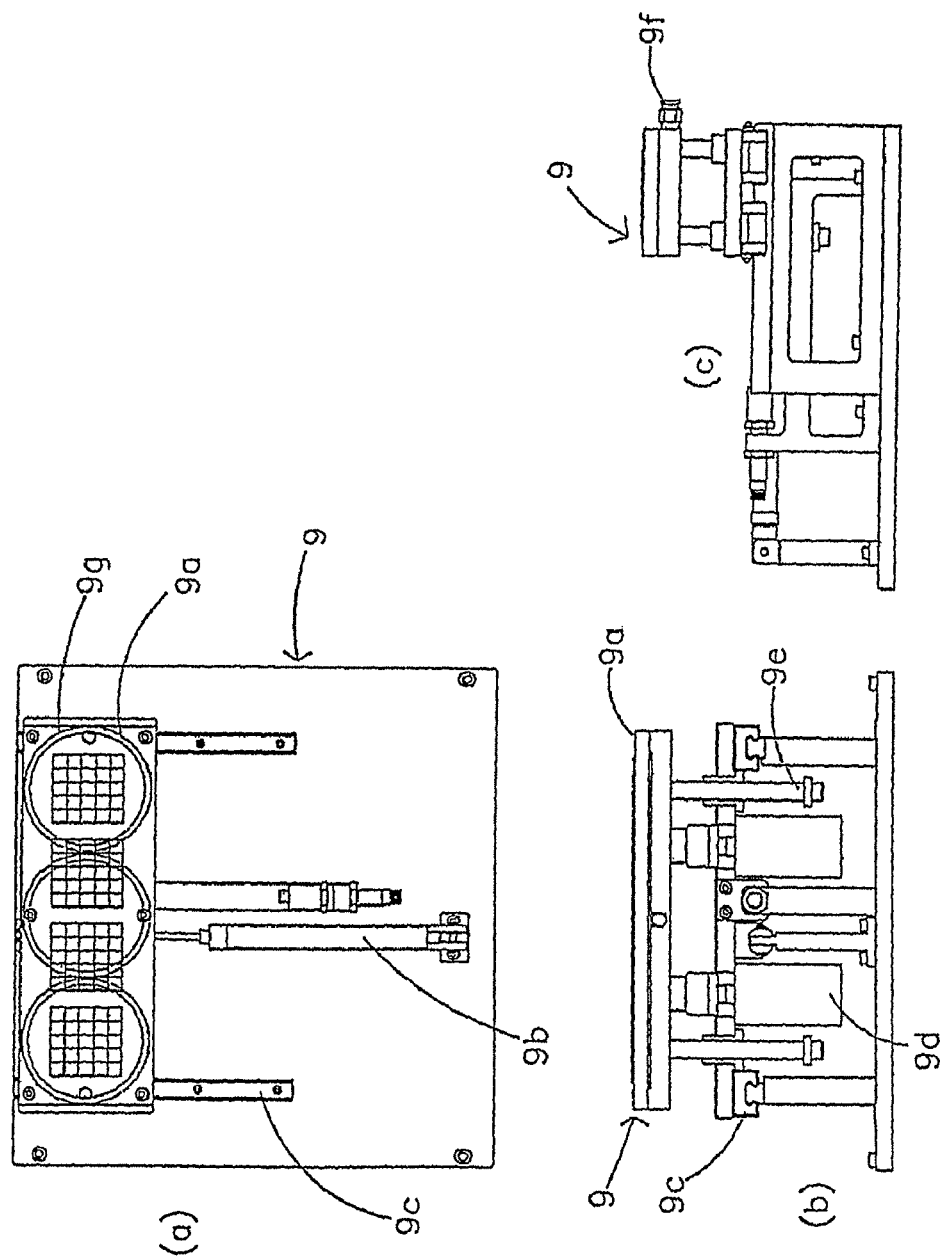
FIG. 9, which is composed of FIGS. 9(a) to 9(c), shows an idle unit assembly of the embodiment of FIG. 1.

The next section of the system is the idle block assembly 9 shown in FIG. 9. FIG. 9(a) is a top view, FIG. 9(b) is a view looking opposite to the direction X, and FIG. 9(c) is a view looking in the direction Y. The idle block assembly 9 includes an idle block 9a located beneath the flipper block 8a. After the flipper block 8a has been rotated such that the singulated units 7a face down, the idle block 9a is raised, until the singulated units 7a contact its horizontal upper surface. This is performed by an idle block lifting mechanism including up/down cylinders 9d and up/down guide posts 9e. A vacuum source is then applied in communication with apertures in the upper surface of the idle block 9a, to retain the singulated units 7a on the idle block. The vacuum source of the flipper unit 8 is then deactivated. The idle block 9a is then lowered again.

The idle block 9a can also be moved horizontally (in the left-right direction on FIG. 1(b)) by a forward-backward cylinder 9b along a horizontal rail 9c. This is done until the idle block 9a is no longer beneath the flipper block 8a. The idle block 9a passes beneath a second camera Ae. Using data collected by the camera Ae, a computer system analyses the marking status and condition of the singulated units 7a (note that it is seeing the surface of the singulated units 7a opposite the ball grid array), and identifies any units having an abnormal marking status or condition. This data is stored by the computer system for later use (as described below).

The idle block 9a is then raised until its upper surface is approximately at the same height as the upper surface of the flipper unit 8a, so that (as described below) the singulated units 7a can conveniently be picked up again by the idle lifter assembly Az. The idle lifter Ac is lowered over the singulated units, and its vacuum source AL again activated to retain the singulated units 7a. The vacuum source of the idle block 9a is then deactivated. The idle lifter Ac is then used to move the singulated units 7a onto the upper surface of a net block 10a of a net block assembly 10.

Figure 10A:
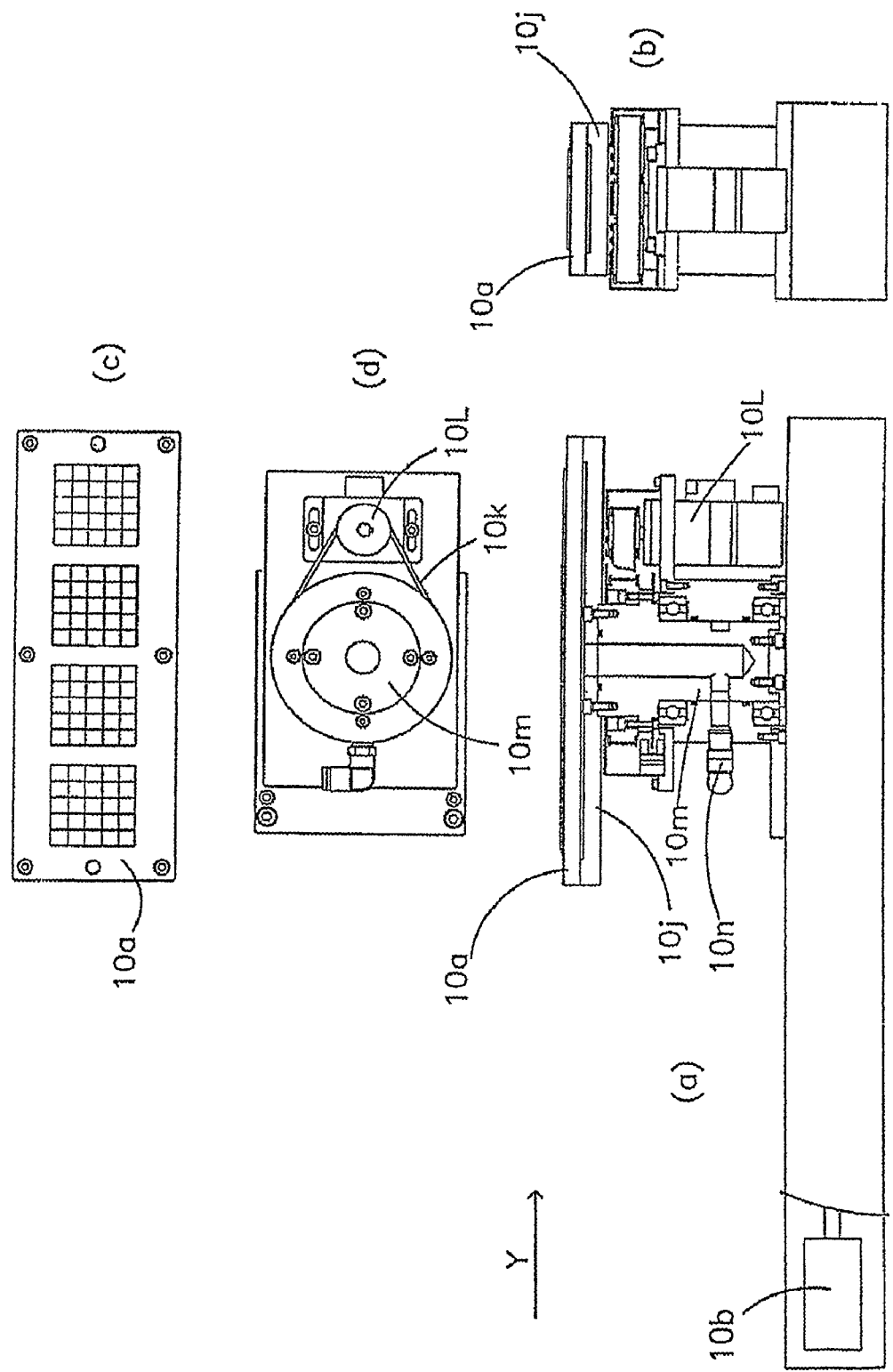
FIG. 10, which is composed of FIGS. 10(a) to 10(i), shows a net block assembly of the embodiment of FIG. 1.
Figure 10B:
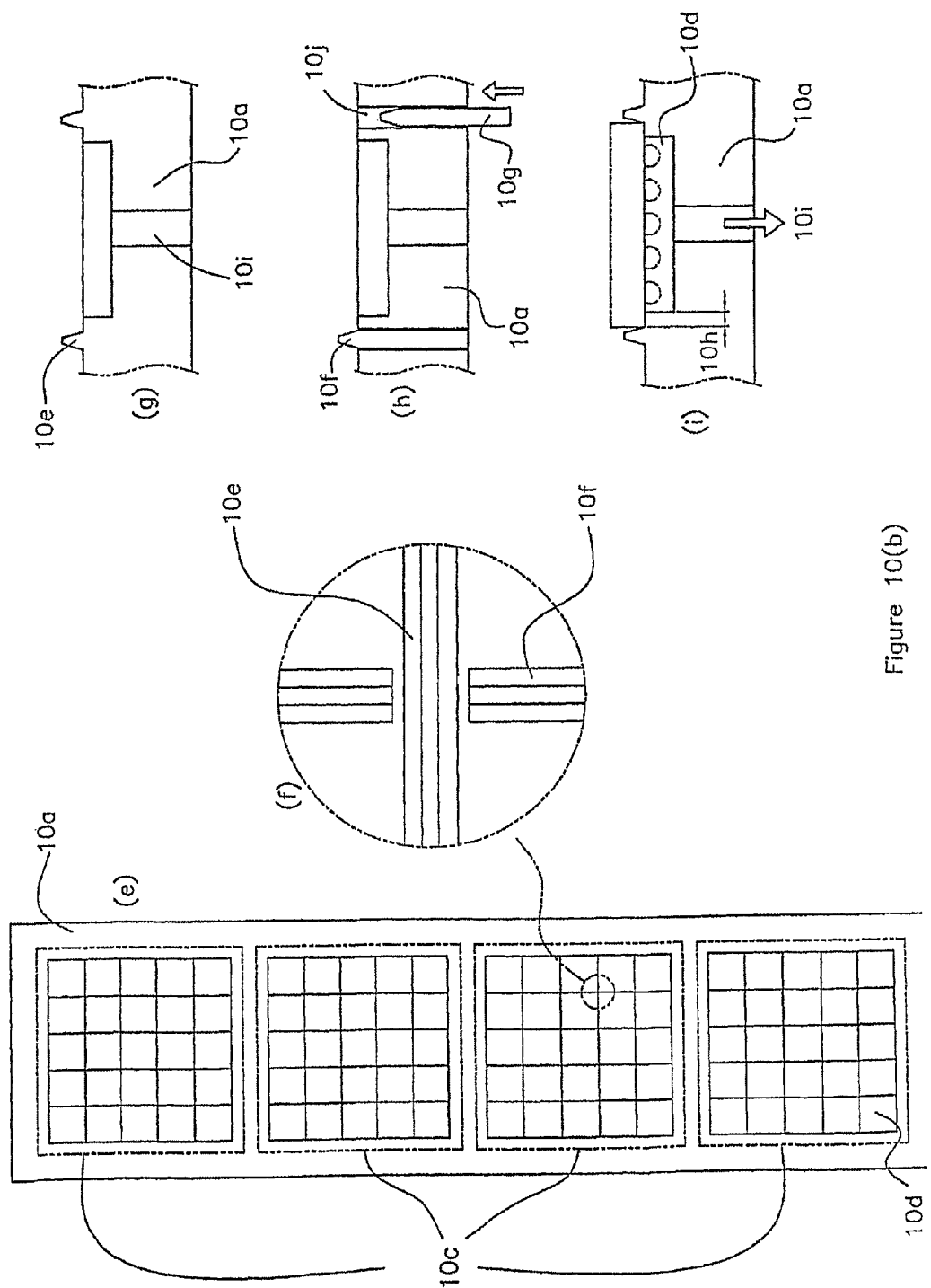

FIG. 10(a) shows the net block assembly 10 looking in the direction opposite to direction X, FIG. 10(b) shows the net block assembly looking in direction Y. FIG. 10(c) is a top view of a net block 10a of the net block assembly 10. FIG. 10(d) shows how the net block assembly 10 would appear if the net block 10a were removed.

FIG. 10(e) is an enlarged top view of a portion of FIG. 10(c). FIG. 10(f) is an enlarged view of a portion of FIG. 10(e). FIGS. 10(g) and 10(h) show two cross-sections through the net block 10a in respective mutually transverse vertical planes. FIG. 10(i) corresponds to FIG. 10(g), and illustrates the operation of the net block 10a.

As shown in FIGS. 10(a) and 10(b), the net block 10a of the net block assembly 10 is supported on a rectangular plate 10j mounted at the top of a vertical shaft 10m. The shaft 10m can be reciprocated (in the left-right direction in FIG. 10b) by a servo-motor 10b. The shaft 10m can be rotated by a servo motor 10L via a rubber belt 10k.

As shown in FIG. 10(e), the top surface of the net block 10a has a number of pockets 10d corresponding to the number of singulated units. The pockets 10d are arranged in groups 10c corresponding in number and arrangement to the singulated units 7a obtained from a single one of the substrates 1b. All of the singulated units 7a from one of the substrates 1b are placed into the respective pockets 10d of one of these groups 10c.

The pockets 10d are defined by ridges 10e, 10f, here referred to as "anvils". The anvils 10e are formed by grinding the upper surface of the net block 10a, and all extend in parallel (in the horizontal direction as shown in FIG. 10(f). The anvils 10f are formed by the upper curved portions of laminar elements 10g which extend through laminar slots in 10j in the net block 10a, as shown in FIG. 10(h). An advantage of this forming the pockets in this way (i.e. rather than providing integral ridges 10e extending over the surface of the net block 10a in both transverse directions) is that it means that the upper net block 10a can be formed by grinding.

Each of the pockets 10d is in register with a respective conduit 10i which can be put into communication with a vacuum source, so that one of the singulated elements 7a can be retained in the pocket 10d. The connection between the conduits 10i and the vacuum source is via a channel in the shaft 10j and a conduit 10n. After one of the units 7a is placed into the pocket 10d, the negative pressure in the pocket 10d sucks the unit 7a towards the bottom of the pocket 10a, and the shaping of the anvils 10e, 10f means that the unit 7a becomes properly aligned with respect to the net block 10a. That is, there is a "self-alignment", which reduces the risk of a failure of pickup later. Note that this self-alignment property would be useful even if there were no flipping in the embodiment (i.e. if the flipper unit 8 is omitted), and/or if the singulated units did not have a ball-grid array.

Once properly in the pockets, the singulated units 7a are moved in the direction Y toward the lifter assembly 11A at the rear portion of the system (i.e. the top of FIG. 1(a)) by a servo motor 10b which drives the net block 10a. During this time, motor 10L is used to rotate shaft 10m.

The lifter assembly is shown in top view in FIG. 11(a), in FIG. 11(b) looking in the direction opposite to X, and in FIG. 11(c) looking in the direction Y. The lifter assembly 11A includes a number (e.g. at least three) of unit lifter assemblies 11a, each of which is moved horizontally (left-right in FIG. 1(a)) by a respective linear series actuator 11c. Each unit lifter assembly 11a includes a number (e.g. at least four) of sets of individual unit lifters 11*b*. Each individual unit lifter 11*b* is actuated up and down by a respective individual linear motor 11*d*. Once the servo motor 10*b* has moved the net block 10*a* to the rear of the system, rotation of the net block 10*a* brings each of the lifter assemblies 11*a* into register (in the direction Y) with one of the rows of singulated units 7*a*. Each individual unit lifter 11*b* lifts a respective one of the singulated units 7*a*, and moves the lifted unit in the direction indicated by the arrow 11*f* to be above a ball vision inspection camera 11*e*.

Figure 11:
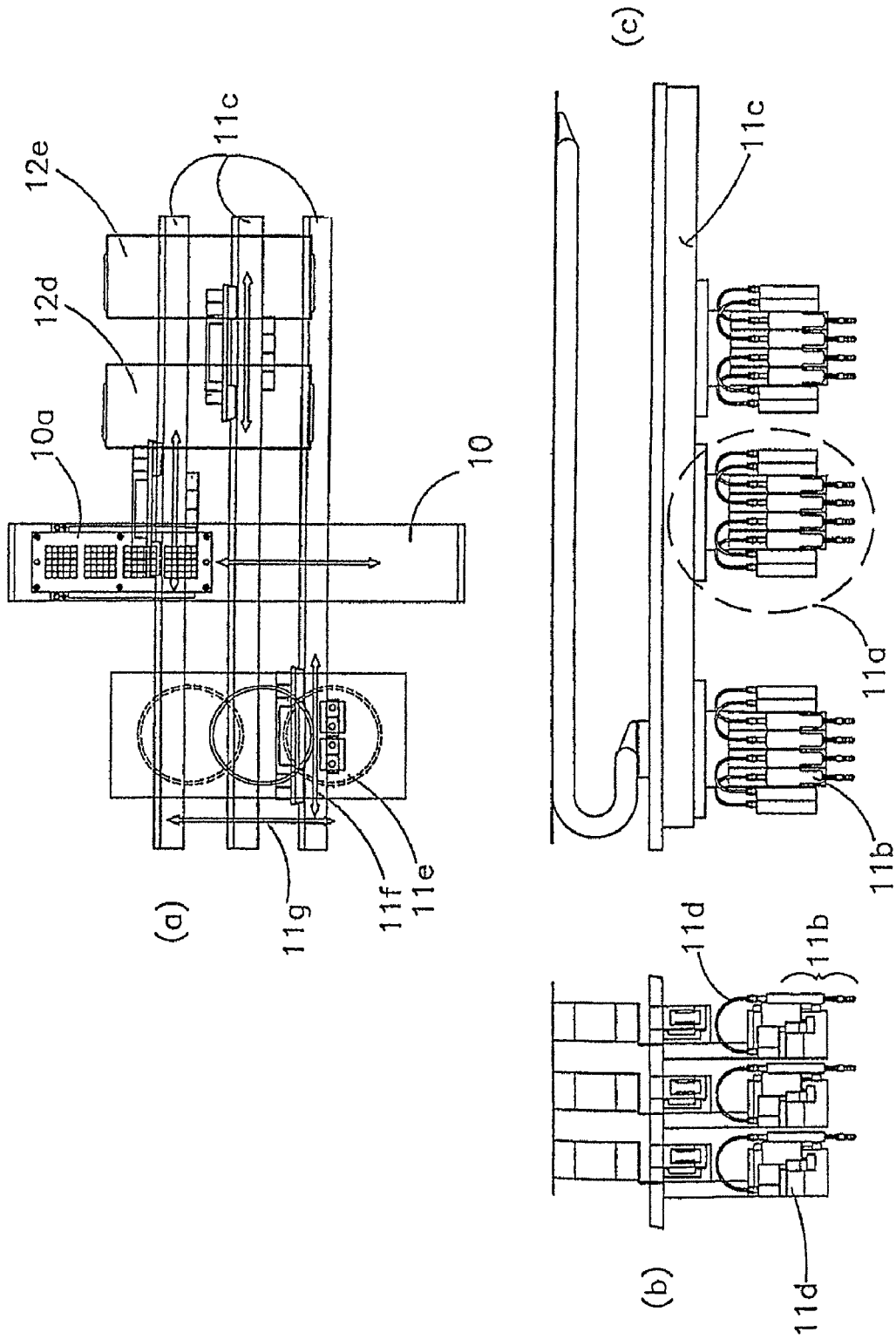
FIG. 11, which is composed of FIGS. 11(a) to 11(c), shows a lifter assembly of the embodiment of FIG. 1.

There may be any number of camera(s) 11*e*, and, like the net block 10*a*, each of the cameras 11*e* can be moved in the Y direction. In FIG. 11(*a*) there is just a single camera 11*e*, which is shown in three possible positions spaced apart in the Y direction, and movable between these positions, as indicated by the arrow 11*g*.

Thus, each unit 7*a* can be photographed from beneath in any 3-dimensional position relative to one of the cameras 11*e*. Note that the ball grid array is facing downwards. The 2-D images captured by the camera(s) 11*e* are input to a computer system for inspecting the status, condition, features and patterns of the balls. For example, if any of the balls have become detached from an integrated circuit, this can be determined straightforwardly. Optionally, this may include determining sophisticated parameters of the units, such as their offset relative to a preferred position, their co-planarity and their warpage.

Based on this determination (and the results from the earlier quality determination based on the output of the camera Ae) a determination is made for each of the units individually whether to move the unit is normal or abnormal. According to the result, the computer system controls the individual unit lifter 11*b* to place the corresponding unit on the normal unit tray 12*d* or on the abnormal unit tray 12*e*.

Figure 12:
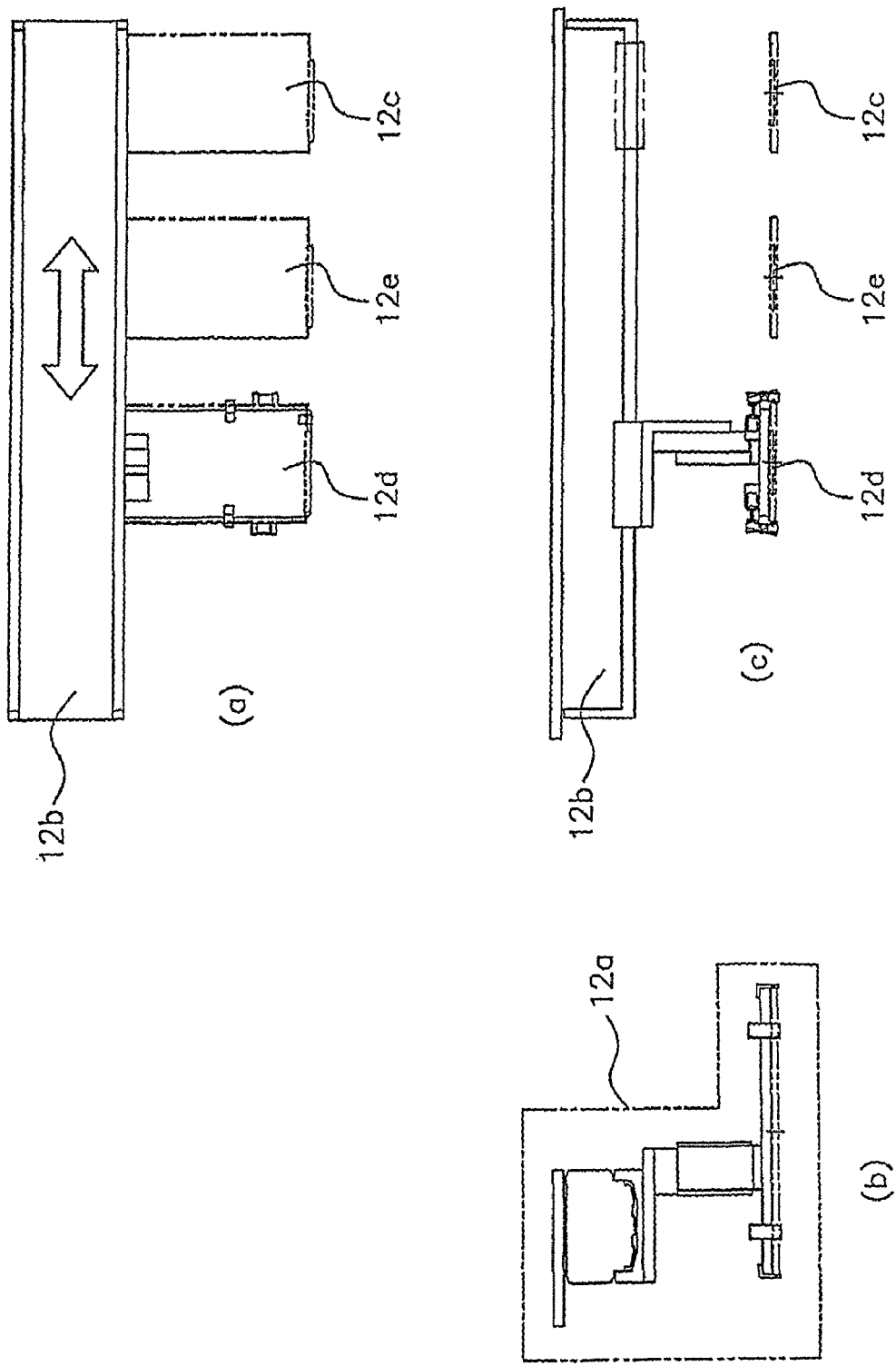
FIG. 12, which is composed of FIGS. 12(a) to 12(c), shows a tray lifter assembly of the embodiment of FIG. 1.

When a normal unit tray 12*d* or an abnormal unit tray 12*e* is filled it is removed from the system, and a vacant tray is inserted from a location 12*c* into the place of the removed tray. This performed by a tray lifter assembly 12. FIG. 12(*a*) is a top view of the tray lifter assembly 12, FIG. 12(*b*) is a view of the tray lifter assembly 12 looking in the direction X, and FIG. 12(*c*) is a view of the tray lifter assembly 12 looking in the direction Y.

While the normal unit tray 12*d* and abnormal unit tray 12*e* are being filled, these trays are located at positions along a linear conveyor 12*b*. The linear conveyor 12*b* also extends over a location at which a vacant unit tray 12*c* is positioned. The conveyor 12*b* carries a tray lifter unit 12*a* which in turn is capable of lifting a tray.

Figure 13:
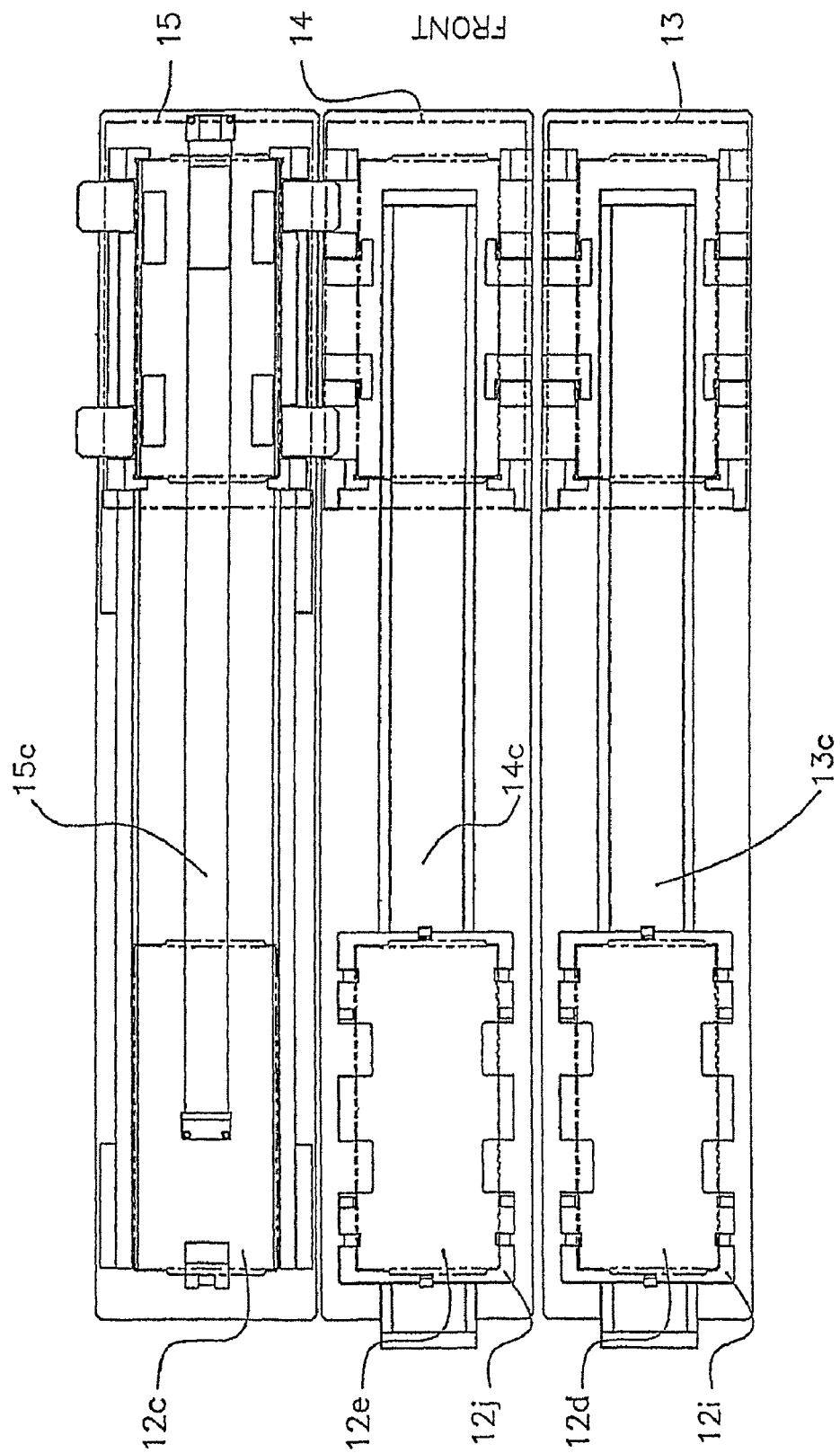
FIG. 13 is a top view of the tray lifter assembly of FIG. 12, and a normal tray stacking assembly, an abnormal tray stacking assembly and a vacant tray stacking assembly.
Figure 14A:
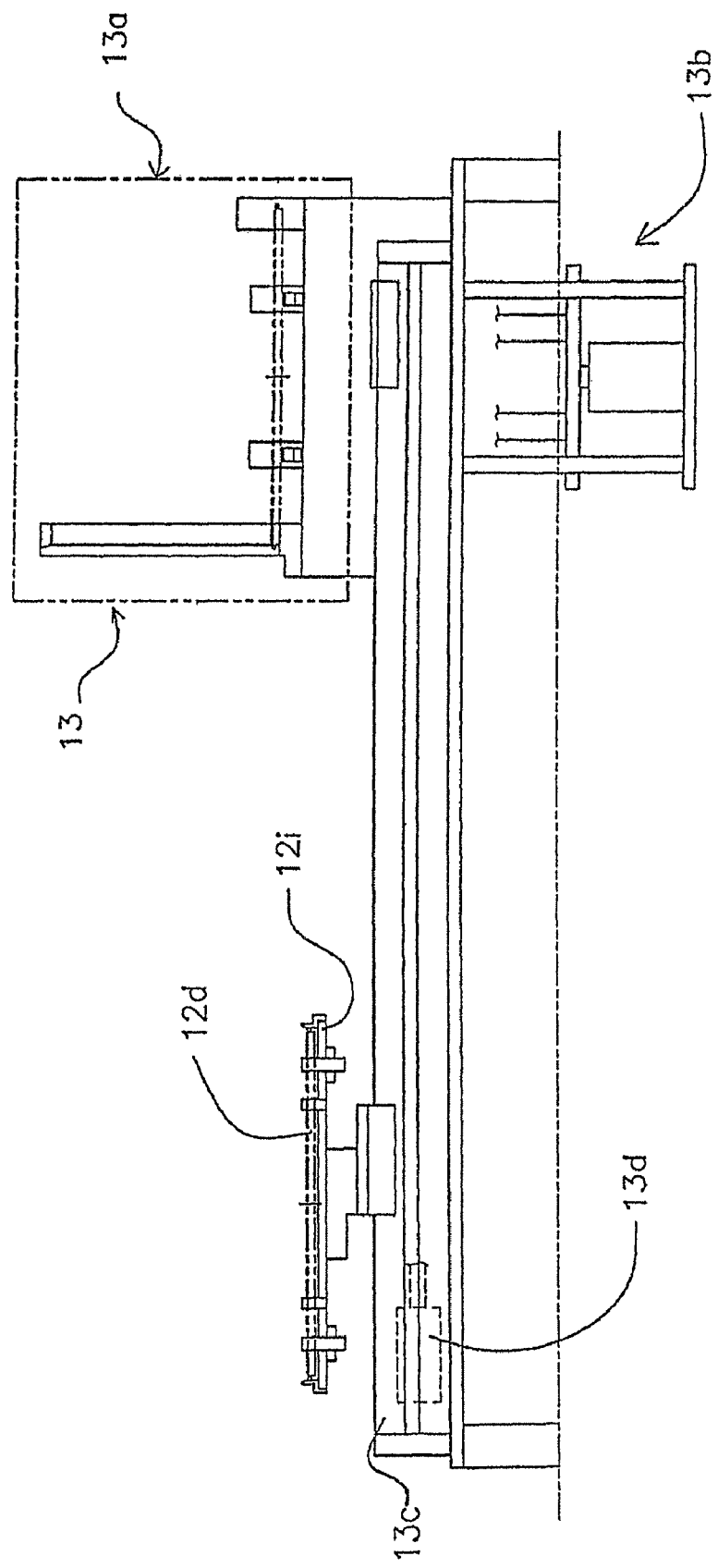
FIG. 14, which is composed of FIGS. 14(a) and 14(b), shows the normal tray stacking assembly and abnormal tray stacking assembly of FIG. 13.
Figure 14B:
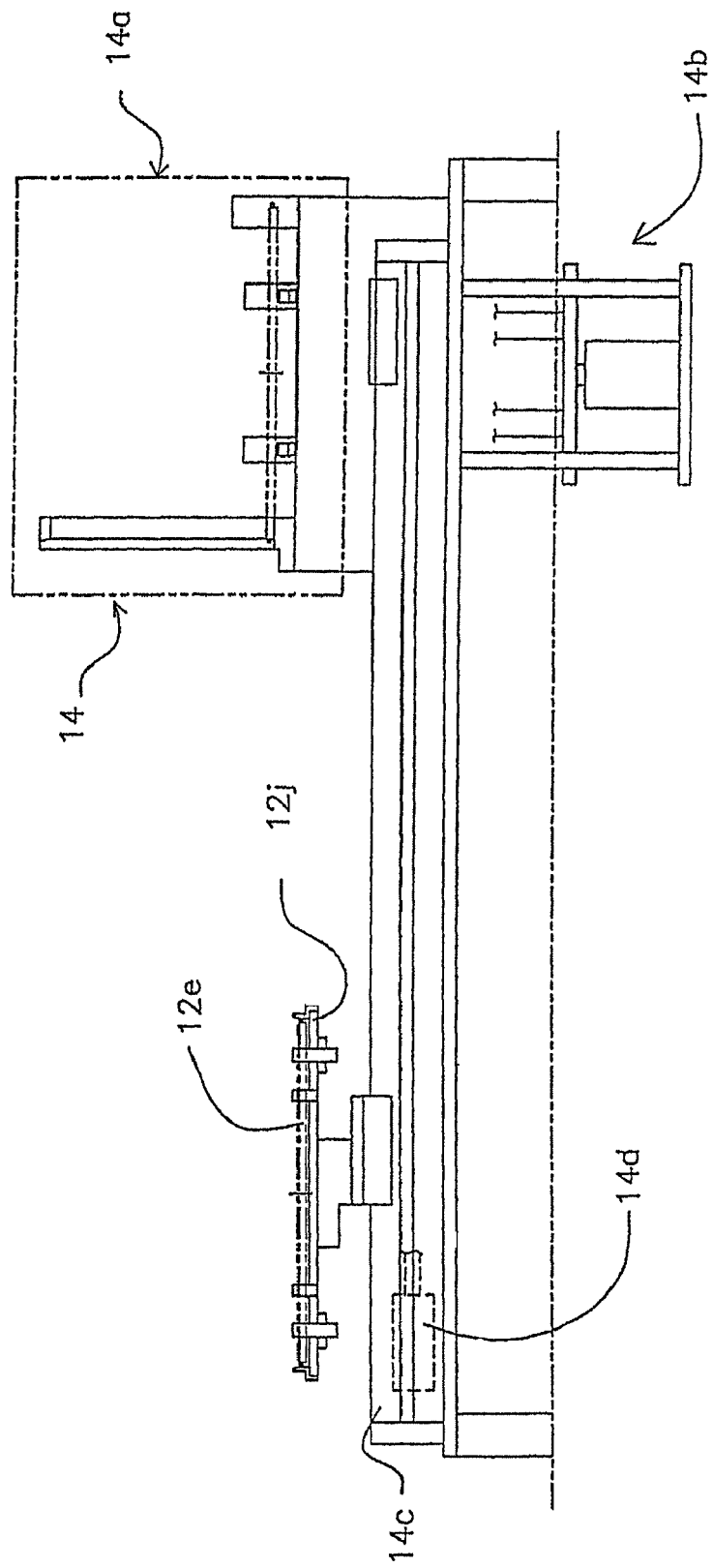

The structure of the mechanism for removing the full normal trays is shown in FIG. 13 in top view and FIG. 14(*a*) in a view looking in the direction X.

The normal unit tray 12*d* and abnormal unit tray 12*e* are located respectively on a normal tray plate 12*i* and an abnormal tray plate 12*j*. When the normal tray 12*d* is filled, the normal tray plate 12*i* it rests on is conveyed in the direction opposite to Y along a track 13*c* by a conveyor 13*d*, to a normal tray stack assembly 13. At the normal tray stack assembly 13, the trays filled with normal units removed from the plate 12*i* and stacked in a section 13*a* using a drive system located in a section 13*b*. Usually, at least 30 trays may be stacked in the assembly 13.

Similarly, when the abnormal tray 12*e* is filled, the normal tray plate 12*j* it rests on is conveyed in the direction opposite to Y direction along a track 14*c* by a conveyor 14*d*, to an abnormal tray stack unit 14. At the abnormal tray stack assembly 14, the trays filled with abnormal units are removed from the plate 12*j* and stacked in a section 14*a* using a drive system located in a section 14*b*. Usually, at least 30 trays may be stacked at this position. The structure of the mechanism for removing the trays full of abnormal units is shown in FIG. 14(*b*), and is identical to that of FIG. 14(*a*) except that the reference numerals 12*d*, 12*i*, 13, 13*a*, 13*b*, 13*c*, 13*d* are replaced by the units 12*e*, 12*j*, 14, 14*a*, 14*b*, 14*c*, 14*d* respectively.

Whenever, as described in one of the preceding paragraphs, a normal tray 12*d* or abnormal tray 12*e* is removed, the tray lifter unit 12*a* carries the vacant tray 12*c* into its place.

Figure 15:
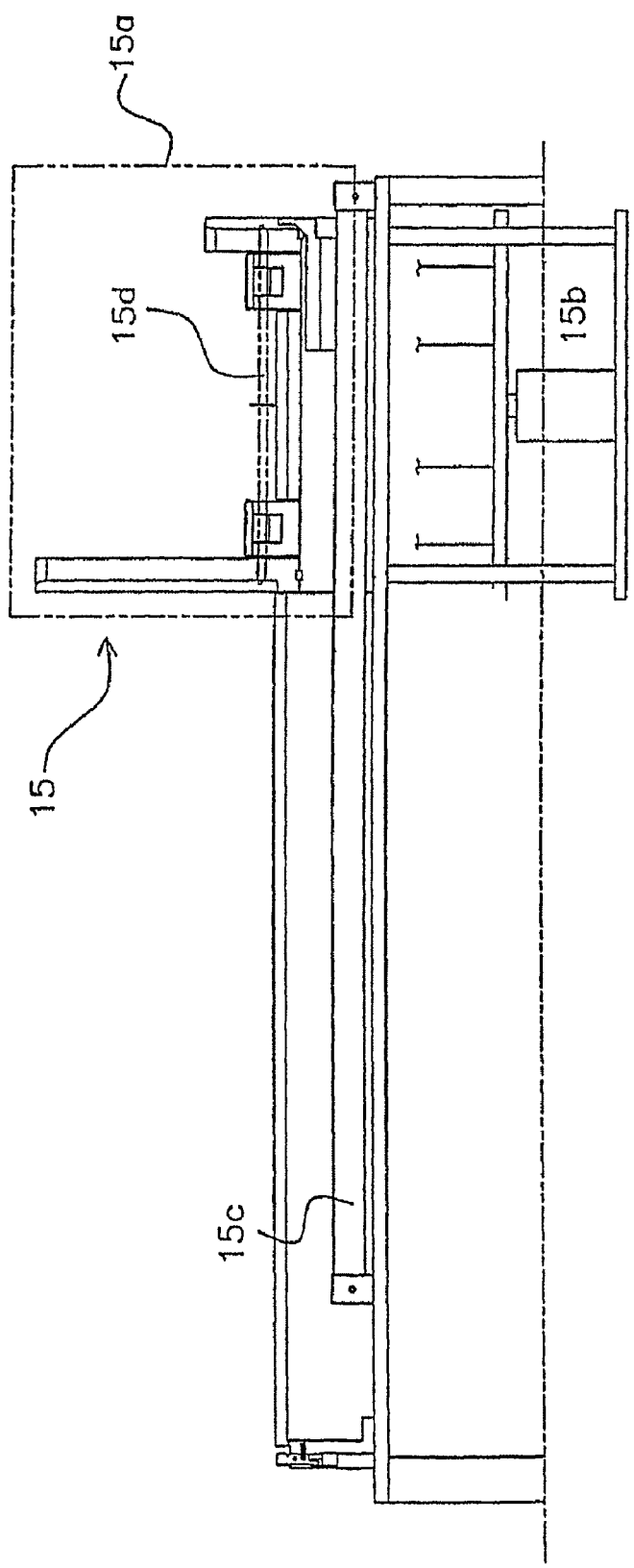
FIG. 15 shows the vacant tray stacking assembly of FIG. 13.

The position the vacant tray 12*c* formerly occupied is filled with a new vacant tray by a vacant tray supply assembly. The vacant tray supply assembly consists of a vacant tray stack unit 15 where vacant trays are stacked in a region 15*a* under the control of a drive unit located in section 15*b* (preferably this unit should be capable of storing at least 30 vacant trays), and a linear conveyor 15*d* which conveys vacant trays along a track 15*c* from the vacant tray stack unit 15 to the position 12*c*. The structure of this mechanism is shown in top view in FIG. 13, and in FIG. 15 looking in the direction X.

Note that in other arrangements the number of these trays is varied. For example, in some variants of the embodiment abnormal units 7*a* may be further classified, according to the type of abnormality they suffer from. The abnormal units may then be placed in one of a number of abnormal unit trays according to the type of abnormality identified.

In general, the substrate comprises panels of units, each unit representing an integrated circuit, or possibly a package of such circuits, for instance 2×2 (1×1), 4×4 packages and so forth. The substrates may comprise one or more such panels, depending on the operational requirements. For instance, if the economic requirements of the process require a batch process, the substrate may comprise several panels. Alternatively, if the economics indicate a more "continuous" process is required, that is less number of units and/or residence time of the substrate in the system, then the substrate may comprise fewer or as few as one panel.

Figure 16:
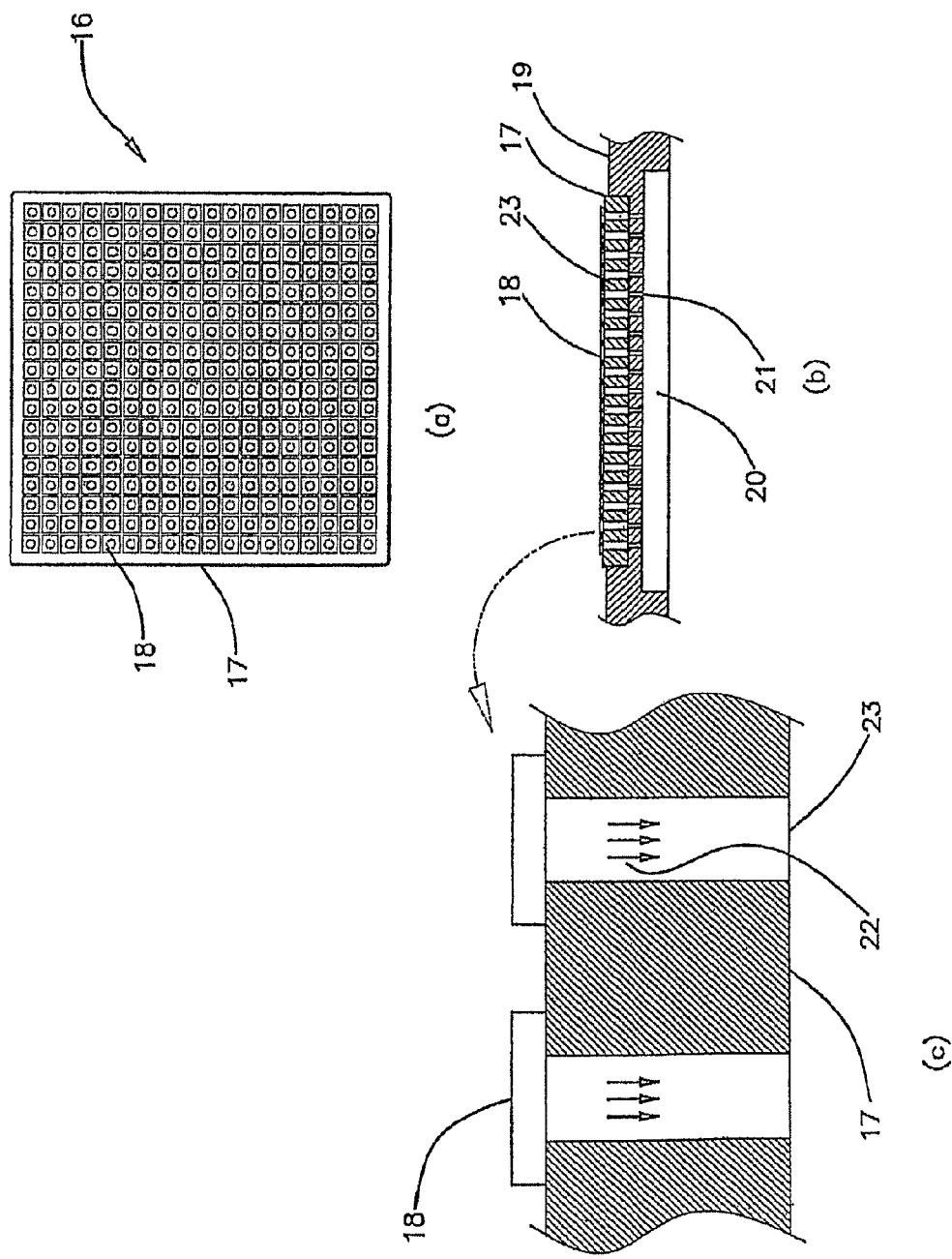
FIG. 16(a) is a plan view of a panel of singulated units.
FIG. 16(b) is an elevation sectional view of the support device according to another embodiment of the present invention.
FIG. 16(c) is a detail view of the support device of FIG. 16(b)

FIG. 16(*a*) is a plan view of a panel 16 of singulated integrated circuit units 18. The units 18 are held in place upon a support device 17, which is used to fix the panel 16 in place during dicing of the panel 16 and subsequently to hold the individual units 18 in place ready for transfer to the next station.

FIG. 16(*b*) is a side elevation view of the panel 16 showing the vacuum arrangement, which maintains the units 18 in place.

The vacuum system comprises a vacuum recess or manifold 20, which is maintained at a suitable negative pressure. The manifold 20 is in communication through a holding frame 19 via recesses 21. The support device 17, which is typically made of a soft material such as any suitable elastomeric material including, but not restricted to silicon rubber or polyurethane further has apertures 23, which correspond to the recesses 21 of the support frame. The apertures 23 within the support device 17 correspond to each individual unit 18. Thus, the vacuum manifold 20 is in direct communication with the units 18 through the recesses of the support frame and the apertures of the support device.

This is shown in better detail in FIG. 16(*c*) being a detailed view of a support device. Here it can be shown that the units 18 cover the apertures 23 in the support device 17. The vacuum pressure 22 applied through the apertures hold the units in place until ready for release at the next station.

Figure 17:
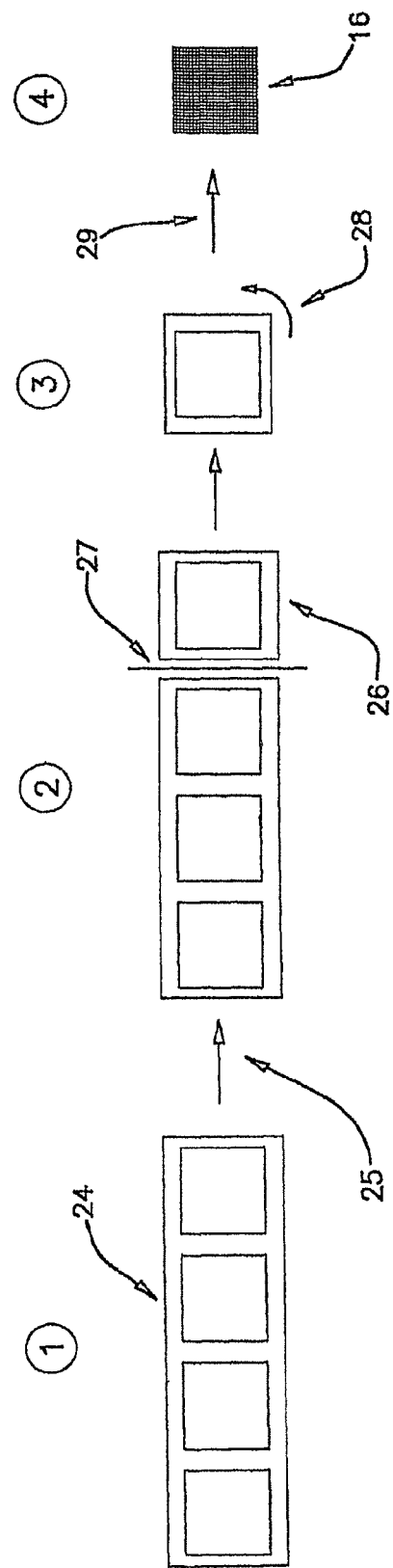
FIG. 17 is a schematic view of a separating device according to a further embodiment of the present invention.

FIG. 17 shows, in one embodiment of the present invention, an upstream process whereby substrate 24 may not be ideal for use within the system and is therefore selectively reduced in size before delivery to chuck table. Thus, the original substrate 24 is moved 25 to a separating device. The separating device, under the control of the operator, is instructed as to a predetermined number of panels, which are to be processed at one time. In this case, the predetermined number is one panel 26, which is singulated 27 from the remainder of the original substrate 24. The single substrate, being a single panel 26, is then rotated and moved into a convenient orientation for delivery to the chuck table. Subsequently, the single panel 26 is diced so as to create an array of singulated units 16 ready for delivery to the next stage of the process.

Figure 18:
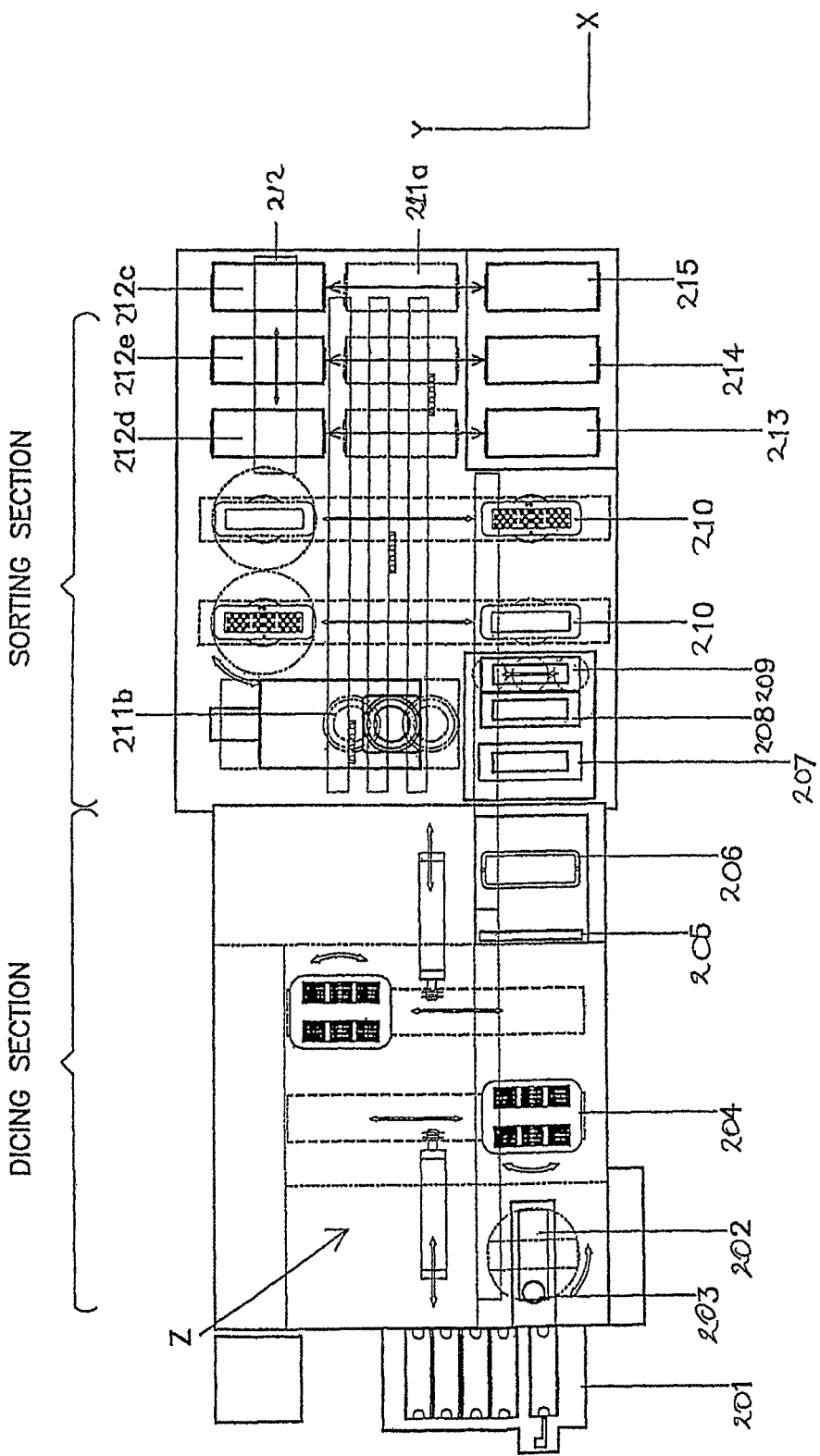
FIG. 18 is a top view of an integrated circuit sawing and sorting system according to a further embodiment of the present invention.
Figure 19:
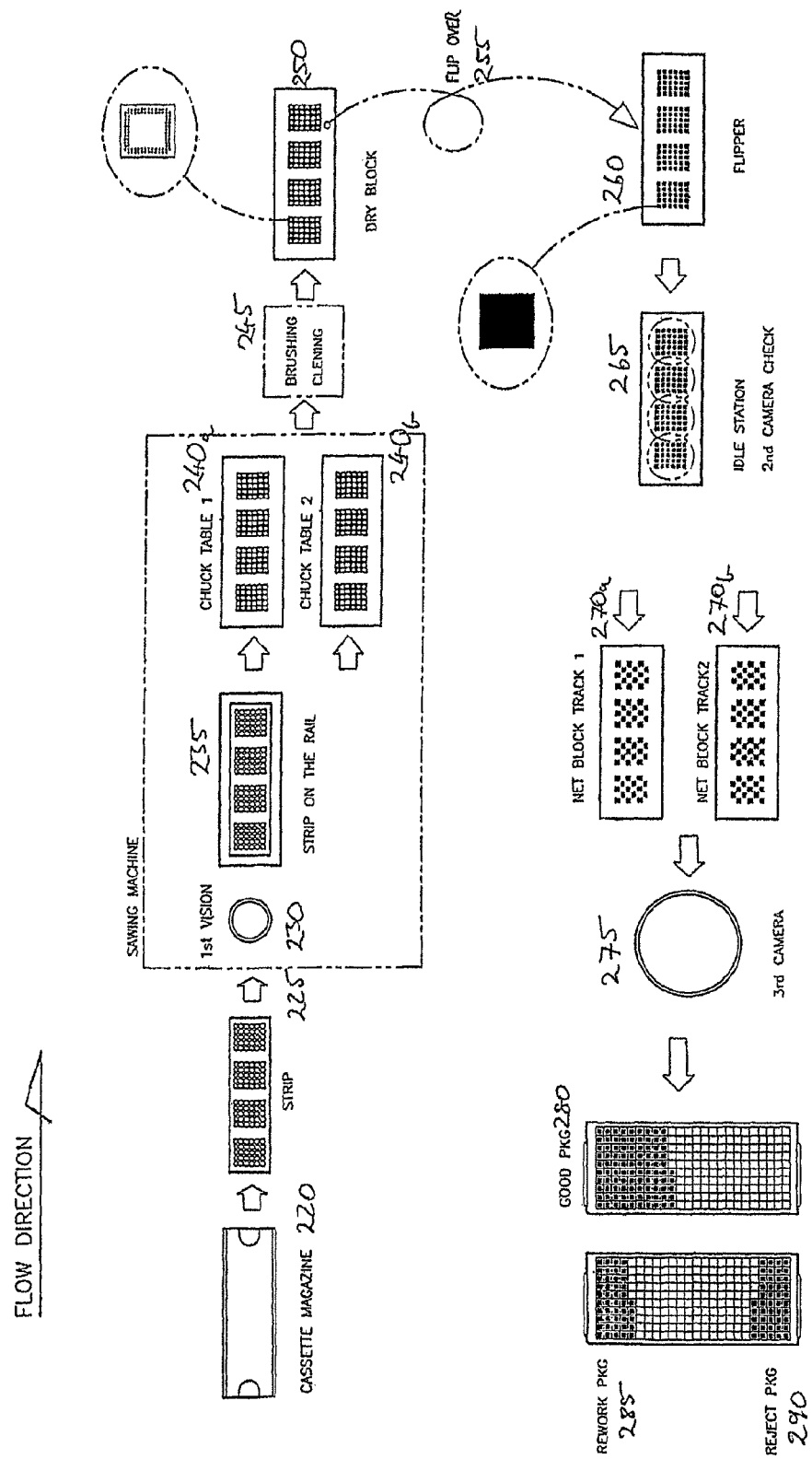
FIG. 19 is a flow chart of the process according to the embodiment of FIG. 18.

FIGS. 18 and 19 show the overall construction of an integrated circuit sawing and sorting system and the underlying process by which the system functions, in a preferred embodiment of the present invention. In FIG. 18, the system is viewed from above. It is composed of two sections, a dicing section and a sorting section. Two horizontal directions are marked X and Y.

The sawing and sorting system is for sawing and sorting substrates which include a plurality of integrated circuits. The system is particularly suitable for integrated circuits each of which is provided with an array of contacts on a side of the substrate which is initially facing upwards (however the system may be modified for other sorts of integrated circuits, as described below). The substrates are inserted into the system from cassettes using a loader assembly 201. From the loader assembly 201 the substrates are carried to an inlet rail assembly 202. At this stage the substrates are examined using a first camera 203, mainly to check that the substrates are of a type suitable for use in the sawing and sorting system.

As described in detail below, the substrates pass to a twin chuck table 204, from which they are carried into a dicing machine indicated generally as Z, and shown in more detail in FIG. 20. This dicing machine Z can be formed according to known designs, and so will not be described here in detail.

The diced substrates pass via a brush unit 205 where the singulated units are brushed, and a cleaner unit 206, to a heating block assembly 207. From there, the units pass to a flipper unit 208, where, as described in detail below, the units are turned over so that each ball grid array faces downwards. The singulated units are then received by an idle unit assembly 209, including a second camera. Subsequently, the singulated units pass to a net block assembly 210.

In a further embodiment, FIG. 19 shows a strip is delivered 220 to the sawing machine using a cassette magazine. Delivery through the system, and to which the cassette delivers the strip, is a rail passing through each station of the system. Prior to delivery of the strip, it undergoes 230 a first inspection (or vision) and is subsequently delivered to the rail.

The strip, or strips, are sequentially placed on available chuck tables 240a & 240b which are located in the dicing machine Z of FIG. 17. To accelerate the flow, the chuck tables 240a & 240b are sequentially staggered, such that a strip is passed to the next available chuck table, and passed through the dicing machine. This has the advantage of emulating a continuous process, rather than a batch process, whereby a backlog of strips may cause a bottleneck in the process waiting upon the dicing of each strip. Thus, whilst the prior art may require a delay of 30 seconds whilst waiting to load the next strip, the sequentially staggered chuck tables 240a & 240b reduce this to about 12 seconds in this embodiment. In further embodiments, there may be a plurality of chuck tables, such that any delay, instead of being as a result of the dicing process may be caused by the delivery time of new strips. In this embodiment, the processing delay may approach, but may never reach a purely continuous process, that is a zero second delay. It is therefore the intent of the invention to increase the Unit per Hour (UPH) rate of the process, as compared to the prior art.

The singulated units resulting from the dicing process are then brushed and cleaned 245, and heated 250 to remove moisture.

The singulated units, which are held in the spatial arrangement defined by the strips, are flipped 255 so as to have, preferably, the ball grid array facing downwards 260.

The singulated units in the new orientation are further inspected 265, prior to delivery to a net block assembly, whereby they may be divided between available net blocks 270a & 270b, each net block being located on a respective track, ready for a picker to sort said singulated units. Consequently, the singulated units are inspected 275 a final time to determine their efficacy, that is their ability to perform the required functions. This inspection, being substantially visual, then determines whether each individual unit is to categorized as "good" 280, "reworkable" 285, or a "reject" 290.

Figure 20:
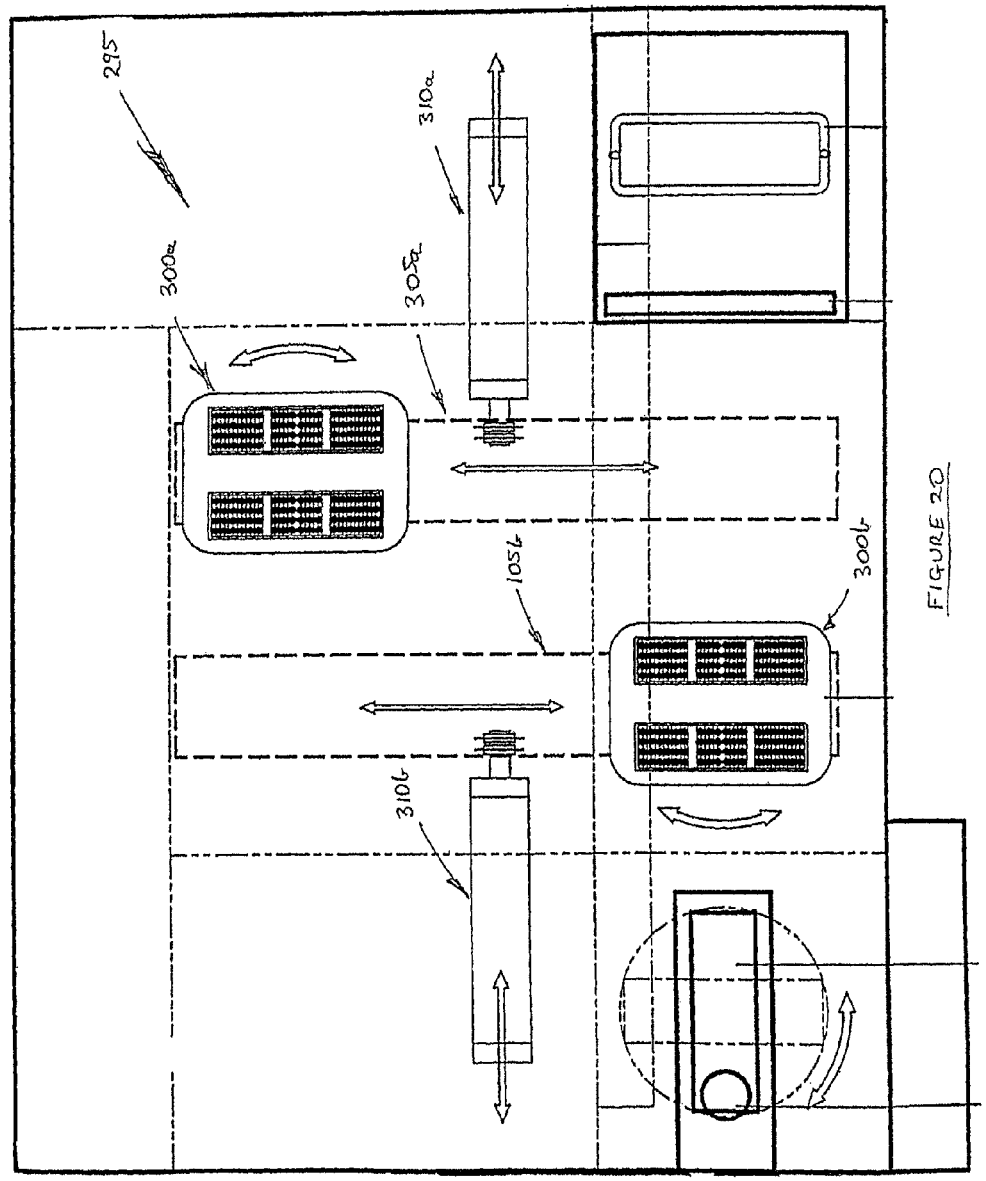
FIG. 20 is a flow chart of a process according to a further embodiment of the present invention.

FIG. 20 shows one embodiment of the dicing machine Z, indicated previously in FIG. 18. Here, the dicing machine 95 comprises two tracks 305a & 305b, each supporting a pair of chuck tables 300a & 300b.

The tracks 305a & 305b operate in a linear direction, so as to pass by cutting stations 310a & 310b. These cutting stations 310a & 310b are designed to also operate linearly, but at right angles to the direction of the tracks. hence, the combination of the two movements of the cutting stations 310a & 310b and the tracks 305a & 305b provide an action whereby two dimensional cutting action of the strips resident on the chuck tables 300a & 300b is possible.

Figure 3:
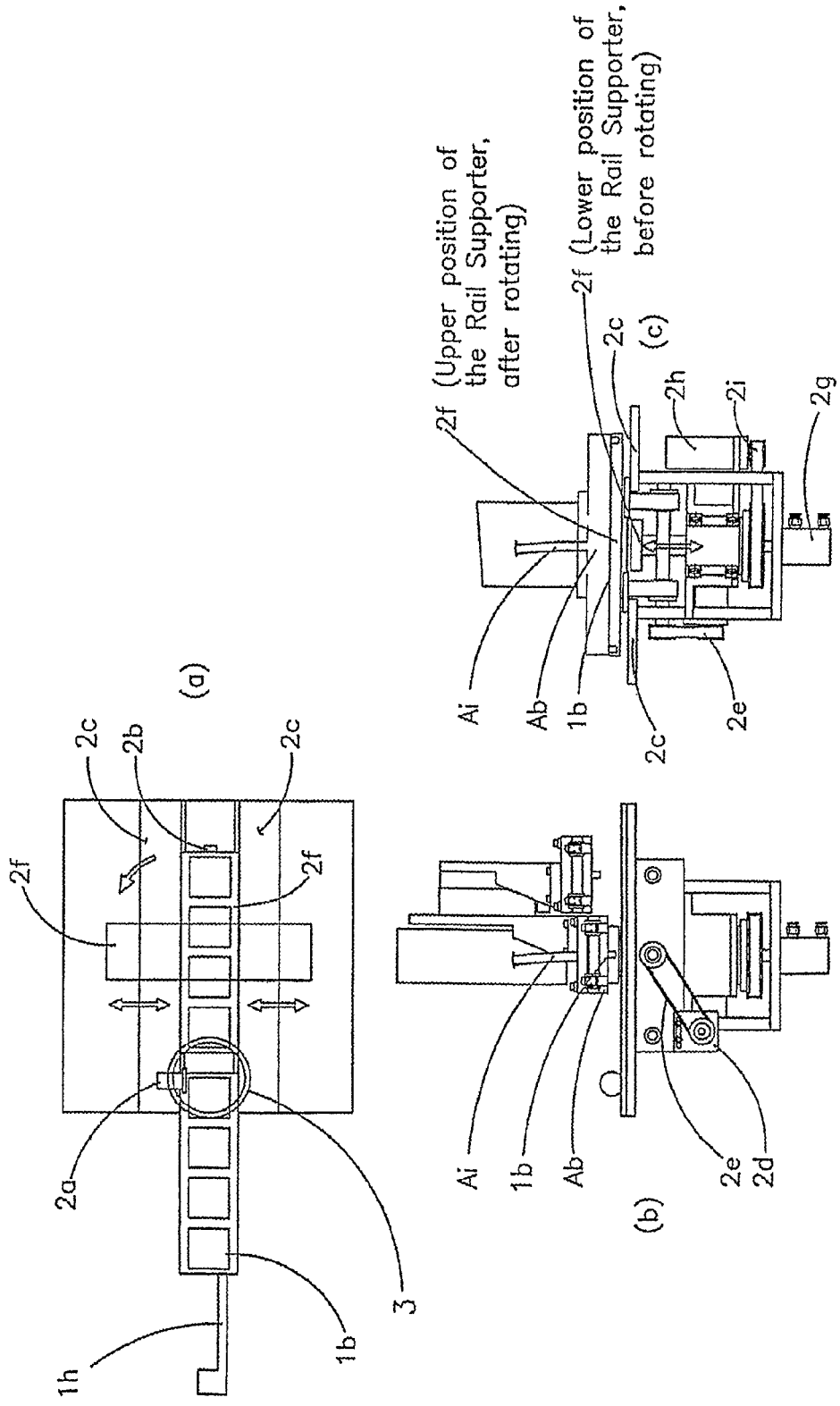
FIG. 3 which is composed of FIGS. 3(a) to 3(c), shows a inlet rail assembly of the embodiment of FIG. 1.

A distinction of the embodiment shown in FIG. 3 is the use of the pair of chuck tables 300a & 300b on the tracks. thus, whereby the UPH using the sequentially staggered process previously described is increased, the UPH is considerably further increased by doubling the capacity of the diving machine.

Any even further distinction, again aiding the increase in UPH is the use of gang blades 310a & 310b at the cutting stations. Having the extra blade again doubles the rate of dicing of the strips, and so directly contributing to the increase in UPH.

Figure 21:
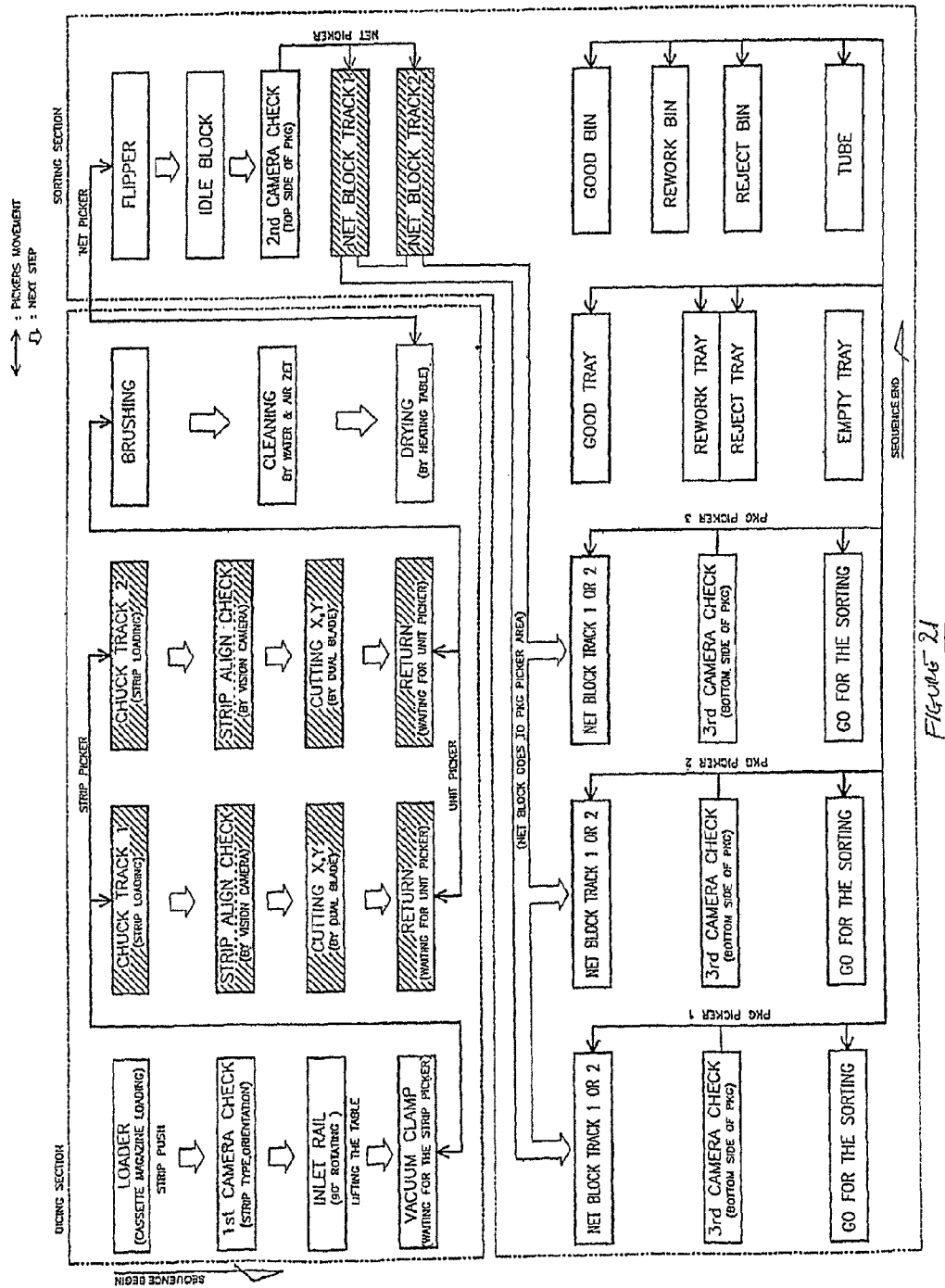
FIG. 21 is a detailed view of a chuck table according to a further embodiment of the present invention.

FIG. 21 shows a more detailed process according to a third embodiment. whereby the activities in each station are more closely defined.

What is claimed is:

1. A method of singulating integrated circuit units formed within substrates, the method including:
    depositing a first substrate on a chuck table at a first location;
    operating a dicing machine to dice the first substrate, and a drive mechanism to move the chuck table to move the diced first substrate to a second location; and
    substantially simultaneously
    (i) picking up the diced first substrate from the chuck table at the second location; and
    (i) depositing a second substrate on the chuck table at the first location.

2. A method for dicing substrates to produce sorted singulated units, comprising the steps of:
    loading said substrates to a rail system;
    delivering said substrates via the rail system to a chuck table arrangement for dicing said substrates;
    loading the substrates to a plurality of chuck tables, at least one chuck table located on a respective track;
    moving the chuck tables along the tracks, past respective cutting means;

singulating units from the substrates using the cutting means, and;

maintaining the relative position of the singulated units within a predetermined spatial relationship corresponding to their position within the substrate prior to singulation;

flipping said substrates whilst maintaining the predetermined spatial arrangement;

delivering the singulated units to a net block assembly to separate and control individual units, and;

sorting and categorizing the individual units so as to separate them by efficacy.

3. The method according to claim 2 wherein individual chuck tables undergo the loading, passing, singulating and maintaining steps in a staggered sequence along the respective tracks so as to minimise delay time between these steps.

4. The method according to claim 2 wherein the step of sorting and categorizing includes determining whether each singulated unit falls within the category of efficacious, non-efficacious or whether the singulated unit requires re-working.

5. A support device for supporting a set of integrated circuit units, the device comprising:

a support frame, said frame having an array of recesses;

a soft material insert, adapted to fit within the support frame, said insert having an array of apertures placed so as to correspond with the recesses of the frame when said insert is fit within said frame; and a vacuum means in communication with each of said recesses and apertures, wherein each unit of the set corresponds to an aperture of the insert and is held in place by the vacuum.

* * * * *